US008890989B2

(12) United States Patent
Yamashita

(10) Patent No.: US 8,890,989 B2
(45) Date of Patent: Nov. 18, 2014

(54) SOLID-STATE IMAGING DEVICE AND METHOD OF MANUFACTURING THE SAME

(75) Inventor: Hirofumi Yamashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1160 days.

(21) Appl. No.: 12/541,519

(22) Filed: Aug. 14, 2009

(65) Prior Publication Data

US 2010/0045837 A1 Feb. 25, 2010

(30) Foreign Application Priority Data

Aug. 19, 2008 (JP) ................................ 2008-210841

(51) Int. Cl.
*H04N 3/14* (2006.01)
*H04N 5/335* (2011.01)
*H04N 5/374* (2011.01)
*H01L 23/48* (2006.01)
*G02B 7/02* (2006.01)
*H01L 27/146* (2006.01)

(52) U.S. Cl.
CPC .......... *H04N 5/374* (2013.01); *H01L 27/14636* (2013.01); *H01L 27/14609* (2013.01); *H01L 2224/48463* (2013.01); *H01L 27/14627* (2013.01); *H01L 27/14643* (2013.01); *H01L 27/14621* (2013.01); *H01L 23/481* (2013.01); *H01L 2924/3011* (2013.01)
USPC ............................. 348/308; 359/811; 359/819

(58) Field of Classification Search
USPC ............. 438/75; 348/308; 257/432–434, 680; 359/811, 819, 823, 824
See application file for complete search history.

(56) References Cited

U.S. PATENT DOCUMENTS 7,030,918 B1 * 4/2006 Nakashiba .................... 348/294
7,495,206 B2 * 2/2009 Park ........................... 250/214.1
(Continued)

FOREIGN PATENT DOCUMENTS

JP 2003-338615 11/2003
JP 2006-19653 1/2006
(Continued)

OTHER PUBLICATIONS

Office Action issued on Jan. 18, 2011, in Japanese Patent Application No. 2008-210841 (with English Translation).
(Continued)

*Primary Examiner* — Tuan Ho
*Assistant Examiner* — Christopher K Peterson
(74) *Attorney, Agent, or Firm* — Oblon, Spivak, McClelland, Maier & Neustadt, L.L.P.

(57) ABSTRACT

A solid-state imaging device includes a pixel region and a driving circuit region which are disposed on a semiconductor substrate, the pixel region being configured such that a photoelectric conversion unit and a signal scanning circuit unit are included and a matrix of unit pixels is disposed, and the driving circuit region being configured such that a driving circuit for driving the signal scanning circuit unit is disposed, a first pad which is provided on a peripheral region on the semiconductor substrate on a side of a light receiving surface, the light receiving surface being formed on a substrate surface which is opposite to a substrate surface where the signal scanning circuit unit is formed, and a second pad which is provided on a side where the signal scanning circuit unit is formed, and which is disposed only at a position overlapping the pixel region.

14 Claims, 19 Drawing Sheets

Entire structure example

(56) References Cited

U.S. PATENT DOCUMENTS

| | | |
|---|---|---|
| 7,675,131 B2 * | 3/2010 | Derderian .................... 257/432 |
| 2005/0099532 A1 * | 5/2005 | Tseng .......................... 348/374 |
| 2006/0022678 A1 * | 2/2006 | Hegazy et al. ................ 324/525 |
| 2006/0118795 A1 * | 6/2006 | Araki ............................ 257/83 |
| 2006/0202318 A1 * | 9/2006 | Satou et al. ................... 257/686 |
| 2008/0083939 A1 * | 4/2008 | Guidash ........................ 257/292 |
| 2008/0087460 A1 * | 4/2008 | Fung ............................ 174/262 |
| 2008/0173792 A1 * | 7/2008 | Yang et al. ................ 250/208.1 |
| 2009/0046183 A1 * | 2/2009 | Nishida et al. ................ 348/294 |
| 2009/0146234 A1 * | 6/2009 | Luo et al. ..................... 257/432 |
| 2009/0230287 A1 * | 9/2009 | Anderson et al. .......... 250/208.1 |
| 2009/0250262 A1 * | 10/2009 | Jin .............................. 174/384 |

FOREIGN PATENT DOCUMENTS

| | | |
|---|---|---|
| JP | 2006-32497 | 2/2006 |
| JP | 2006-128392 | 5/2006 |
| JP | 2007-221134 | 8/2007 |
| JP | 2008-103368 | 5/2008 |
| JP | 2008-205256 | 9/2008 |
| WO | WO 2006/129762 A1 | 12/2006 |

OTHER PUBLICATIONS

Taiwanese Office Action mailed on Mar. 24, 2014, in Taiwanese Patent Application No. 098124883 (with English-language translation).

* cited by examiner

Entire structure example

Plan-view structure example (light illumination surface side): first embodiment

Plan-view structure example (signal scanning circuit formation surface side)
: first embodiment

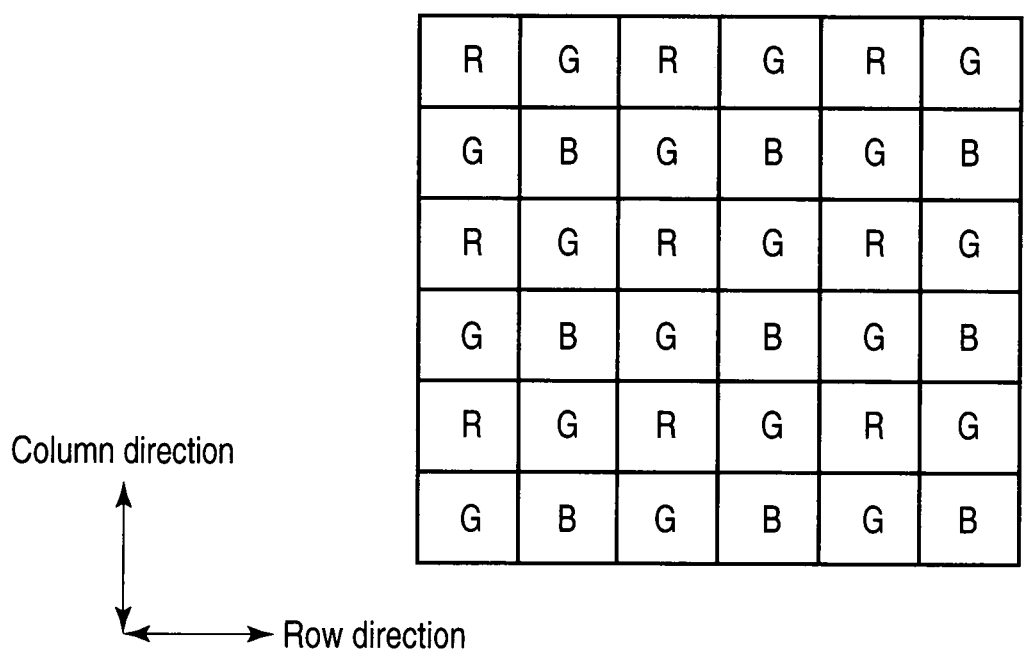
F I G. 6

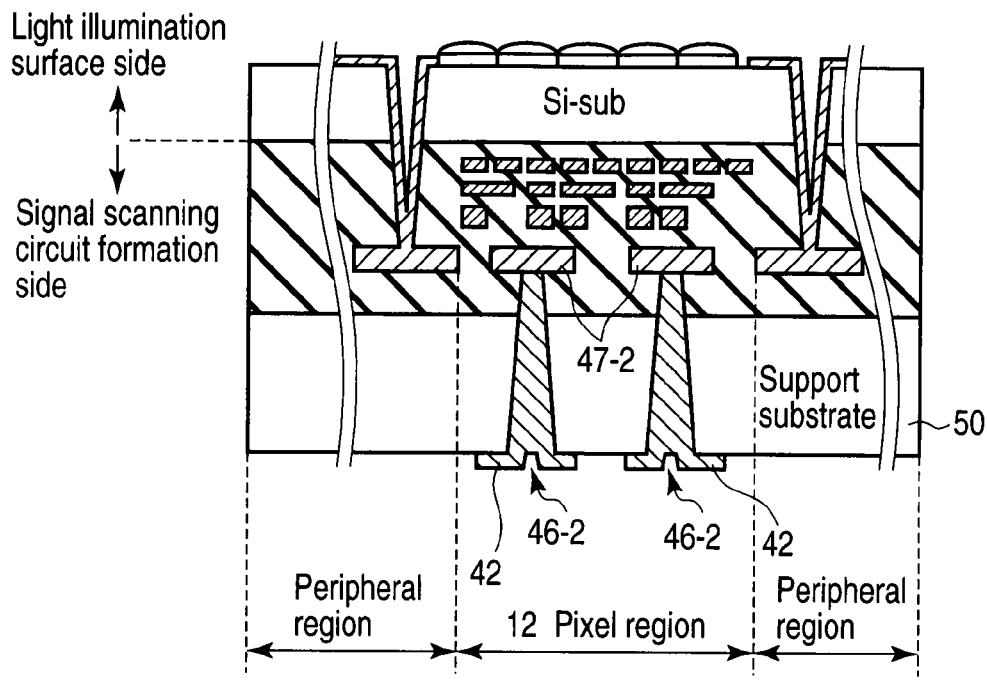
F I G. 1 4
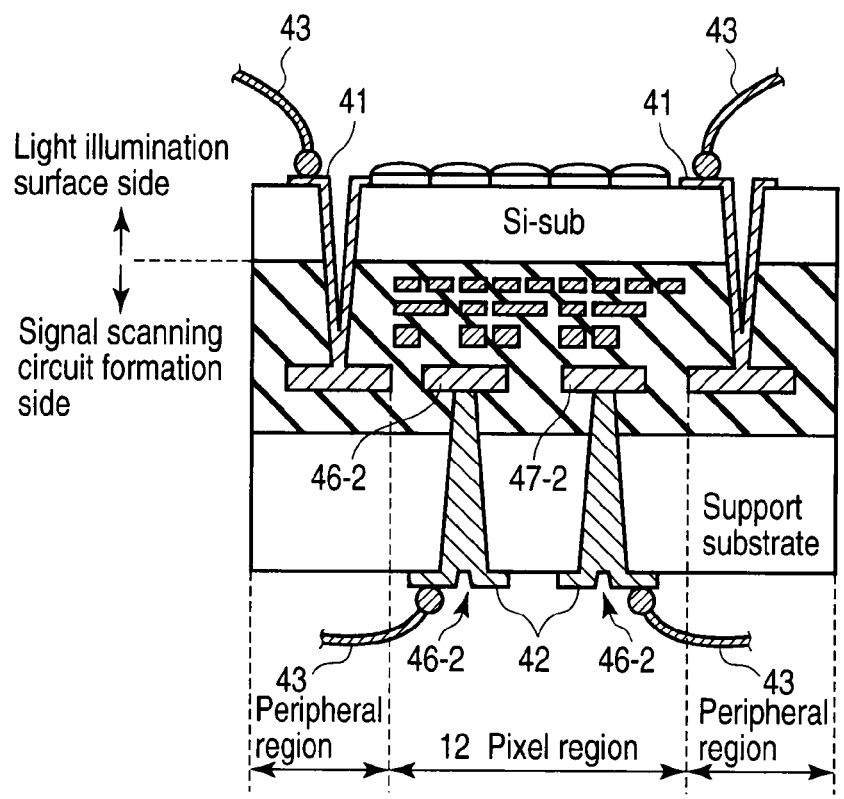
F I G. 1 5

Plan-view structure example (light illumination surface side): second embodiment Plan-view structure example (signal scanning circuit formation surface side)
: second embodiment Plan-view structure example (light illumination surface side): third embodiment Plan-view structure example (signal scanning circuit formation surface side): third embodiment Plan-view structure example (light illumination surface side): comparative example Plan-view structure example (signal scanning circuit formation surface side): comparative example
SOLID-STATE IMAGING DEVICE AND METHOD OF MANUFACTURING THE SAME

CROSS-REFERENCE TO RELATED APPLICATIONS

This application is based upon and claims the benefit of priority from prior Japanese Patent Application No. 2008-210841, filed Aug. 19, 2008, the entire contents of which are incorporated herein by reference.

BACKGROUND OF THE INVENTION

1. Field of the Invention

The present invention relates to a solid-state imaging device and a manufacturing method thereof, and is applied, for example, to a MOS solid-state imaging device.

2. Description of the Related Art

At present, solid-state imaging devices including CMOS sensor are applied to various uses, such as digital still cameras, video movie cameras and monitor cameras. In particular, dominant devices are single-chip imaging devices which acquire plural color information by a single pixel array.

With a demand for an increase in the number of pixels and a decrease in optical size in recent years, there is a tendency that the pixel size is reduced more and more. For example, the pixel size of a CMOS sensor which has widely been used in recent years in digital cameras or the like is about 1.4 µm to about 2.8 µm.

As a structure for coping with such fine pixels, there is known, for instance, a back-surface illumination type solid-state imaging device (see, e.g. Jpn. Pat. Appln. KOKAI Publication No. 2006-128392). In the back-surface illumination type solid-state imaging device, incident light is radiated on a silicon (Si) surface (back surface) which is opposite to the silicon (Si) surface (front surface) on which a signal scanning circuit and its wiring layer are formed. In this back-surface illumination type structure in which light is incident on the silicon (Si) surface which is opposite to the silicon (Si) surface on which the signal scanning circuit and its wiring layer are formed, the light, which is incident on the pixel, can reach a light-receiving region, which is formed within the silicon (Si) substrate, without being blocked by the wiring layer. Thus, even with the fine pixel, a high quantum efficiency can be realized.

BRIEF SUMMARY OF THE INVENTION

According to an aspect of the present invention, there is provided a solid-state imaging device comprising: a pixel region and a driving circuit region which are disposed on a semiconductor substrate, the pixel region being configured such that a photoelectric conversion unit and a signal scanning circuit unit are included and a matrix of unit pixels is disposed, and the driving circuit region being configured such that a driving circuit for driving the signal scanning circuit unit is disposed; a first pad which is provided on a peripheral region on the semiconductor substrate on a side of a light receiving surface, the light receiving surface being formed on a substrate surface which is opposite to a substrate surface where the signal scanning circuit unit is formed; and a second pad which is provided on a side where the signal scanning circuit unit is formed, and which is disposed only at a position overlapping the pixel region in a thickness direction of the semiconductor substrate.

According to another aspect of the present invention, there is provided a method of manufacturing a solid-state imaging device, comprising: forming a signal scanning circuit unit on a surface of a semiconductor substrate, which is opposite to a light illumination surface of the semiconductor substrate; forming a first support substrate on the signal scanning circuit unit; forming a photoelectric conversion unit on the surface of the semiconductor substrate on the light illumination surface side; forming a first via which reaches the signal scanning circuit unit from the surface of the semiconductor substrate on the light illumination surface side in a peripheral region, and forming a first pad from the first via onto the surface of the semiconductor substrate on the light illumination surface side; forming a coupling material on the surface of the semiconductor substrate on the light illumination surface side; forming a second support substrate on the coupling material; and forming a second via which reaches the signal scanning circuit unit from the surface of the first support substrate only in a pixel region other than the peripheral region, and forming a second pad from the second via onto the surface of the semiconductor substrate on the signal scanning circuit unit side.

BRIEF DESCRIPTION OF THE SEVERAL VIEWS OF THE DRAWING

FIG. 6 is a plan view showing a color filter arrangement according to the first embodiment;

FIG. 14 is a cross-sectional view showing a fabrication step of the solid-state imaging device according to the first embodiment;

FIG. 15 is a cross-sectional view showing a fabrication step of the solid-state imaging device according to the first embodiment;

DETAILED DESCRIPTION OF THE INVENTION

Figure 1:
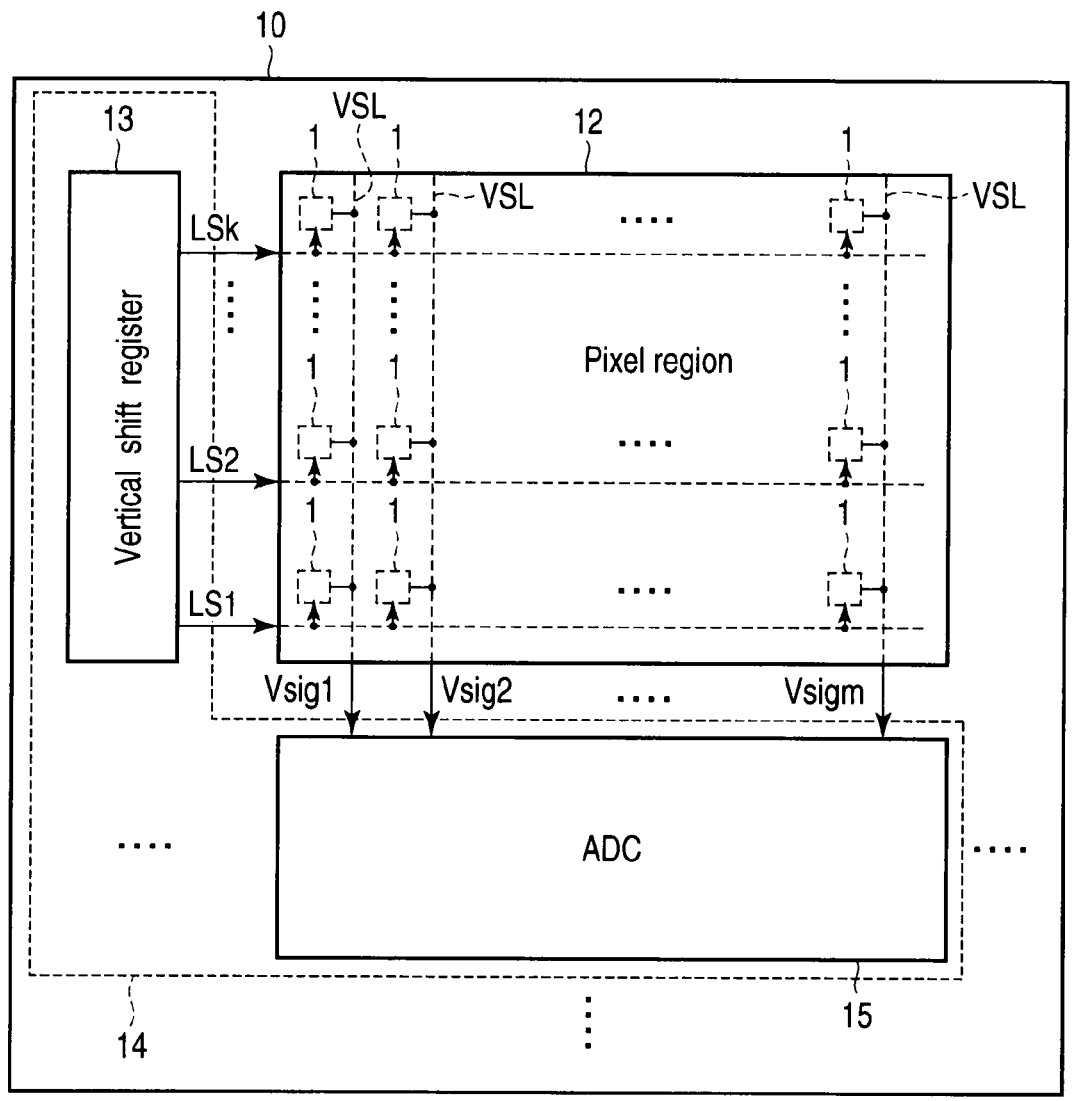
FIG. 1 is a block diagram showing an example of the entire structure of a solid-state imaging device according to a first embodiment of the present invention.

As regards the above-described back-surface illumination type solid-state imaging device, for example, in a structure of a comparative example (to be described later), a pad for applying a reference potential to a signal scanning circuit unit is disposed on a peripheral region on a light illumination surface side. Thus, the reference potential is applied via this pad from the outside of an imaging element chip. Further, the reference potential is applied to a diffusion layer via a wiring and a contact. The diffusion layer, to which the reference potential is applied, is formed in the pixel array in the vertical and horizontal directions, and the reference potential is applied to the inside of the pixel array by this diffusion layer.

When the pixel array is driven, the signal scanning circuit that is disposed in the unit pixel is driven. Consequently, various potential variations occur. For example, a driving pulse is applied to the gate, or a signal line potential varies in accordance with the intensity of incident light which becomes an input signal.

On the other hand, since the reference potential is applied and input from the pad that is disposed on the peripheral region on the light illumination surface side alone, as described above, the reference potential is not directly applied to the unit pixel, but to the outer periphery of the pixel array. Then, when a potential variation occurs in the unit pixel, as described above, the reference potential temporarily varies due to coupling capacitance between the gate and the diffusion layer to which the reference potential is applied, or due to coupling capacitance between the diffusion layer to which a signal potential is applied and the diffusion layer to which the reference potential is applied.

Hence, a difference occurs in reference potential between an end part of the pixel array and a central part of the pixel array. In such a case, a potential of a floating diffusion layer, which executes signal detection in the pixel array, varies between the end part of the pixel array and the central part of the pixel array, and this variation leads directly to a difference in output signal. As a result, a difference in signal amount occurs between the end portion of the pixel array and the central part of the pixel array on the reproduced screen, and, even in the case where a subject with a uniform picture pattern is photographed, a pseudo-signal called "shading" occurs as a non-uniform picture pattern on the reproduced screen. If shading occurs, there is a tendency that the shading becomes noise, and the image quality of the reproduced screen is considerably degraded.

In addition, there is the following tendency. In a case where a subject with a very high luminance is imaged, photoelectrons, which are generated in the substrate by photoelectric conversion, flow into a power supply terminal in the unit pixel, and the photoelectrons flow out, as an electric current, to the outside of the imaging element via the above-described contact and wiring. A potential difference ΔV resulting from this phenomenon is added to the power supply potential of the unit pixel which images the subject with high luminance. In this case, since the signal output varies, a pseudo-signal occurs in a pixel which shares the power supply wiring with the pixel which images the subject with high luminance. As a result, a picture pattern becomes non-uniform on the reproduced screen, and the non-uniformity becomes noise and considerably degrades the image quality of the reproduced screen.

Referring to the accompanying drawings, embodiments of the present invention will now be described. In the description below, common parts are denoted by like reference numerals throughout the drawings. An example to be described below is a back-surface illumination type solid-state imaging device wherein a light receiving surface (light illumination surface) is provided on a surface of a semiconductor substrate, which is opposite to the surface of the semiconductor substrate where a signal scanning circuit unit is formed.

First Embodiment

1. Structure Example

To begin with, referring to FIG. 1 to FIG. 7, a description is given of a structure example of a solid-state imaging device according to a first embodiment of the invention.

1-1. Entire Structure Example

Referring to FIG. 1, an entire structure example of the solid-state imaging device according to this embodiment is described. FIG. 1 is a system block diagram showing an example of the entire structure of the solid-state imaging device according to this embodiment. FIG. 1 shows a structure example in the case where an AD conversion circuit is disposed at a column position of a pixel array.

As shown in FIG. 1, a solid-state imaging device 10 according to this embodiment comprises a pixel array (pixel region) 12 and a driving circuit region 14.

The pixel array 12 is configured such that a photoelectric conversion unit and a signal scanning circuit unit are included in a semiconductor substrate, and a unit pixel matrix is disposed.

The photoelectric conversion unit includes a unit pixel 1, which includes a photodiode for effecting photoelectric conversion and accumulation, and functions as an imaging unit. The signal scanning circuit unit includes, e.g. an amplifying transistor (to be described later), reads out and amplifies a signal from the photoelectric conversion unit, and sends the amplified signal to an AD conversion circuit 15. In the case of the present embodiment, a light receiving surface (photoelectric conversion unit) is provided on the back side of the semiconductor substrate, which is opposite to the semiconductor substrate surface on which the signal scanning circuit unit is formed.

The driving circuit region 14 is configured such that driving circuits, such as a vertical shift register 13 for driving the signal scanning circuit unit and the AD conversion circuit, are disposed.

This description is directed to a part of the entire structure of a CMOS sensor, but the structure is not limited to this example. For example, use may be made of a structure wherein an ADC circuit is not disposed in parallel with the column but an ADC circuit is disposed on a chip level, or a structure wherein an ADC is not disposed on a sensor chip.

The vertical shift register 13 outputs signals LS1 to LSk to the pixel array 12, and functions as a select unit for selecting the unit pixels 1 on a row-by-row basis. Analog signals Vsig, which correspond to the amount of incident light, are output via vertical signal lines VSL from the unit pixels 1 of the selected row.

The AD conversion circuit (ADC) 15 converts the analog signals Vsig, which are input via the vertical signal lines VSL, to digital signals.

1-2. Structure Example of Pixel Array (Pixel Region)

Figure 2:
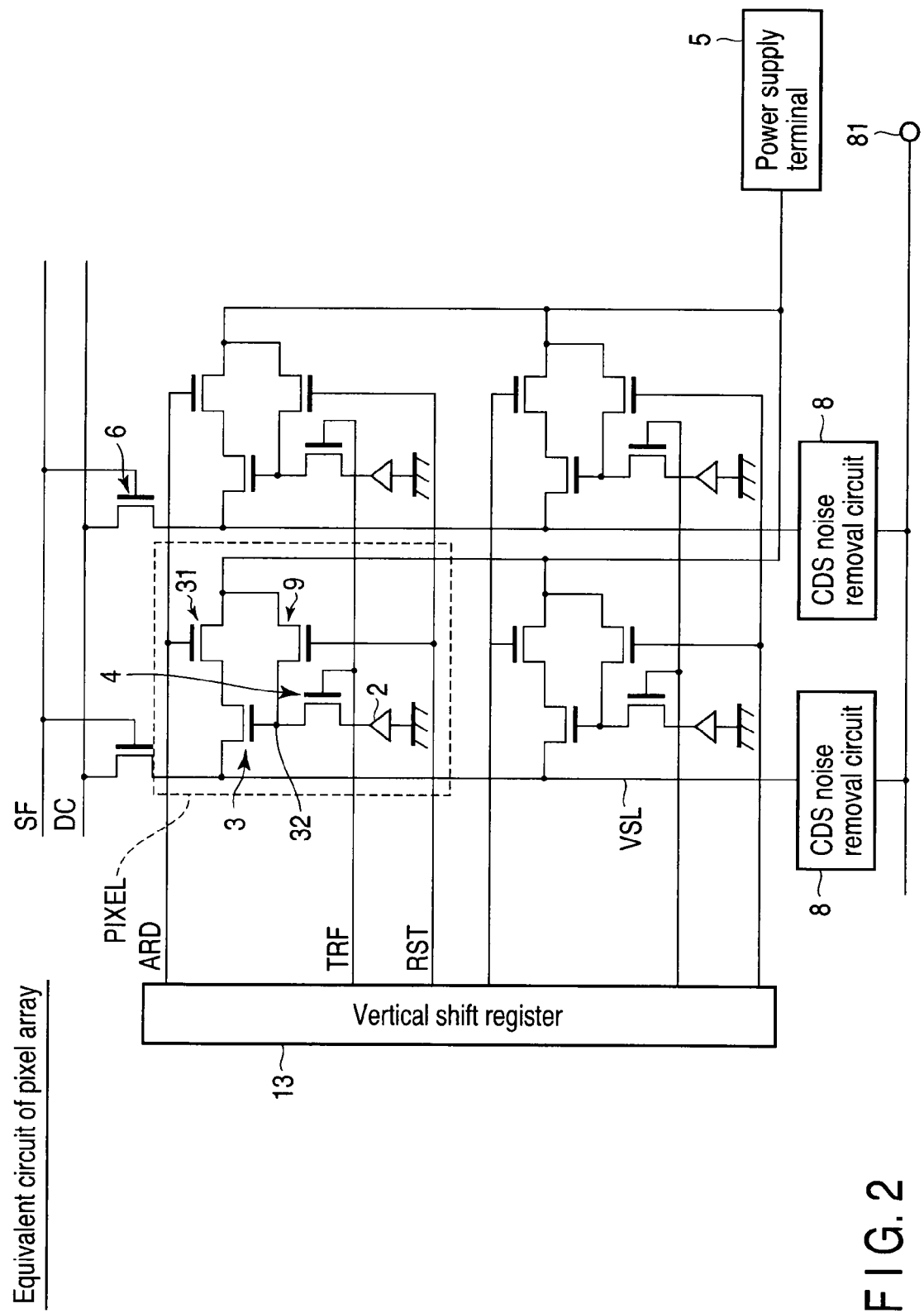
FIG. 2 is an equivalent circuit diagram of a pixel array which is included in the solid-state imaging device according to the first embodiment.

Next, referring to FIG. 2, a description is given of a structure example of the pixel array (pixel region) 12 in FIG. 1. FIG. 2 is an equivalent circuit diagram showing the structure example of the pixel array according to the present embodiment. This example to be described below is a single-chip imaging device which acquires plural color information by the single pixel array 12.

As shown in FIG. 2, the pixel array 12 includes a plurality of unit pixels 1 which are disposed in a matrix at intersections between read-out signal lines from the vertical shift register 13 and the vertical signal lines VSL.

The unit pixel (PIXEL) 1 includes a photodiode 2, an amplifying transistor 3, a read-out transistor 4, a reset transistor 9, and an address transistor 31.

In the above, the photodiode 2 constitutes the photoelectric conversion unit. The amplifying transistor 3, read-out transistor 4, reset transistor 9 and address transistor 31 constitute the signal scanning circuit unit.

The cathode of the photodiode 2 is supplied with a reference potential Vss. As will be described later, the reference potential Vss is applied from a second pad 42 which is disposed on the signal scanning circuit formation surface side.

The amplifying transistor 3 is configured to amplify and output the signal from a floating diffusion layer (floating diffusion) 32. The amplifying transistor 3 has a gate connected to the floating diffusion layer 32, a source connected to the vertical signal line VSL, and a drain connected to the source of the address transistor 31. Noise in an output signal of the unit pixel 1, which is sent from the vertical signal line VSL, is removed by a CDS noise removal circuit 8, and the noise-free signal is output from an output terminal 81.

The read-out transistor 4 is configured to control accumulation of signal charge in the photodiode 2. The read-out transistor 4 has a gate connected to a read-out signal line TRF, a source connected to the anode of the photodiode 2, and a drain connected to the floating diffusion layer 32.

The reset transistor 9 is configured to reset the gate potential of the amplifier transistor 3. The reset transistor 9 has a gate connected to a reset signal line RST, a source connected to the floating diffusion layer 32, and a drain connected to a power supply terminal 5 which is connected to a drain power supply.

The gate of the address transistor 31 is connected to an address signal line ADR.

A load transistor 6 has a gate connected to a select signal line SF, a drain connected to the source of the amplifier transistor 3, and a source connected to a control signal line DC.

Read-Out Driving Operation

The read-out driving operation by this pixel array structure is as follows. To start with, the address transistor 31 of the read-out row is set in an ON state by a row select pulse which is sent from the vertical shift register 13.

Subsequently, the reset transistor 9 is similarly set in an ON state by a reset pulse which is sent from the vertical shift register 13, and is reset at a voltage close to the potential of the floating diffusion layer 32. Then, the reset transistor 9 is set in an OFF state.

Then, the transfer gate 4 is set in an ON state, a signal charge that is accumulated in the photodiode 2 is read out to the floating diffusion layer 32, and the potential of the floating diffusion layer 32 is modulated in accordance with the read-out signal charge number.

Thereafter, the modulated signal is read out to the vertical signal VSL by the MOS transistor that constitutes a source follower, and the read-out operation is completed.

1-3. Plan-View Structure Example

Figure 3:
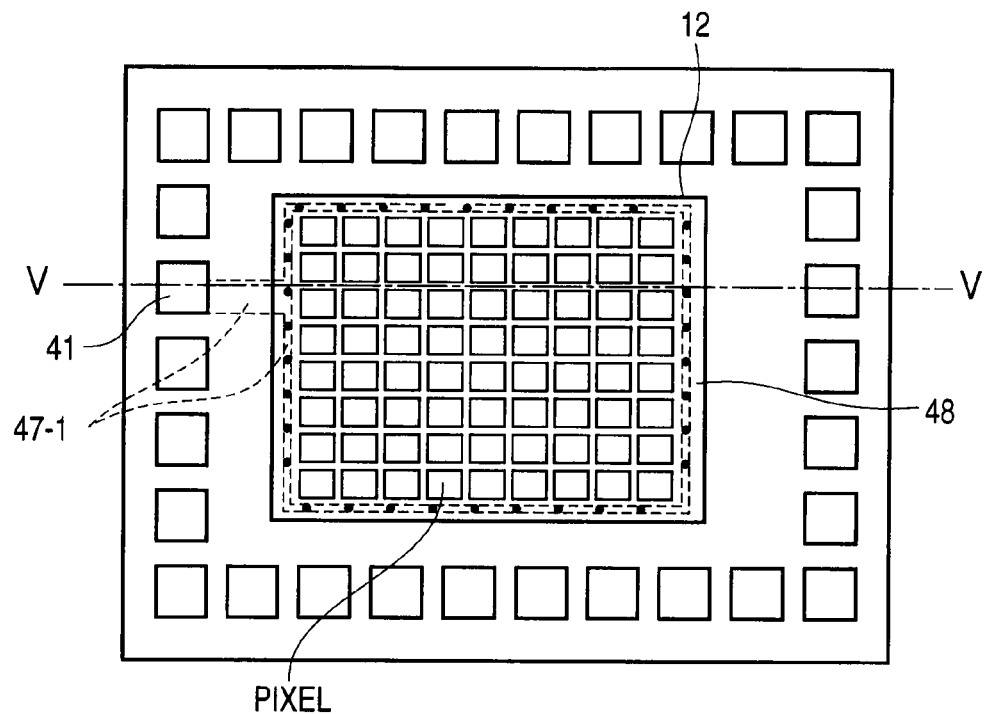
FIG. 3 is a plan view showing a plan-view structure example (light illumination surface side) of the solid-state imaging device according to the first embodiment.
Figure 4:
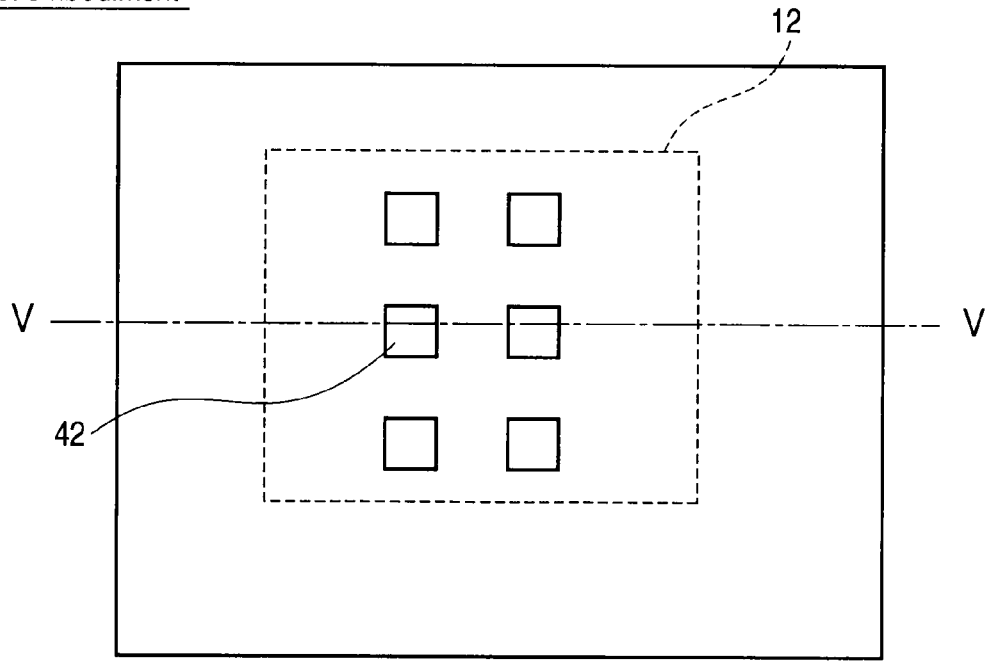
FIG. 4 is a plan view showing a plan-view structure example (signal scanning circuit formation surface side) of the solid-state imaging device according to the first embodiment.

Next, referring to FIG. 3 and FIG. 4, a description is given of a plan-view structure example of the solid-state imaging device according to the present embodiment. FIG. 3 shows a plan-view structure example of the light illumination surface side, and FIG. 4 shows a plan-view structure example of the signal scanning circuit formation surface side that is the back side opposite to the side of FIG. 3.

As shown in FIG. 3, on the light illumination surface side, first pads 41 are disposed on a peripheral region, other than the pixel region 12, so as to surround the pixel region 12. For example, a driving pulse and a signal input/output, other than the reference potential Vss, are applied to the first pads 41. In the meantime, incident light from a coupling optical system is illuminated on this light illumination surface side.

The driving pulse, etc., which are applied to the first pads 41, are delivered to each unit pixel 1 via a signal scanning circuit which is electrically connected to the first pads 41.

As shown in FIG. 4, on the signal scanning circuit formation surface side, second pads 42 are disposed at only positions overlapping the pixel region 12 in the thickness direction of the semiconductor substrate. The reference potential Vss, which is not applied to the first pads 41, is applied to the second pads 42. Thus, the second pads 42 are pads for reference potential (Vss).

As will be described later, the reference potential Vss, which is applied to the second pads 42, is applied to each unit pixel 1 by a diffusion layer 48, which is disposed in a lattice fashion in the pixel region 12 in a manner to surround the unit pixels 1, via a wiring layer 47-2 which is electrically connected to the second pads 42.

1-4. Cross-Sectional Structure Example

Figure 5:
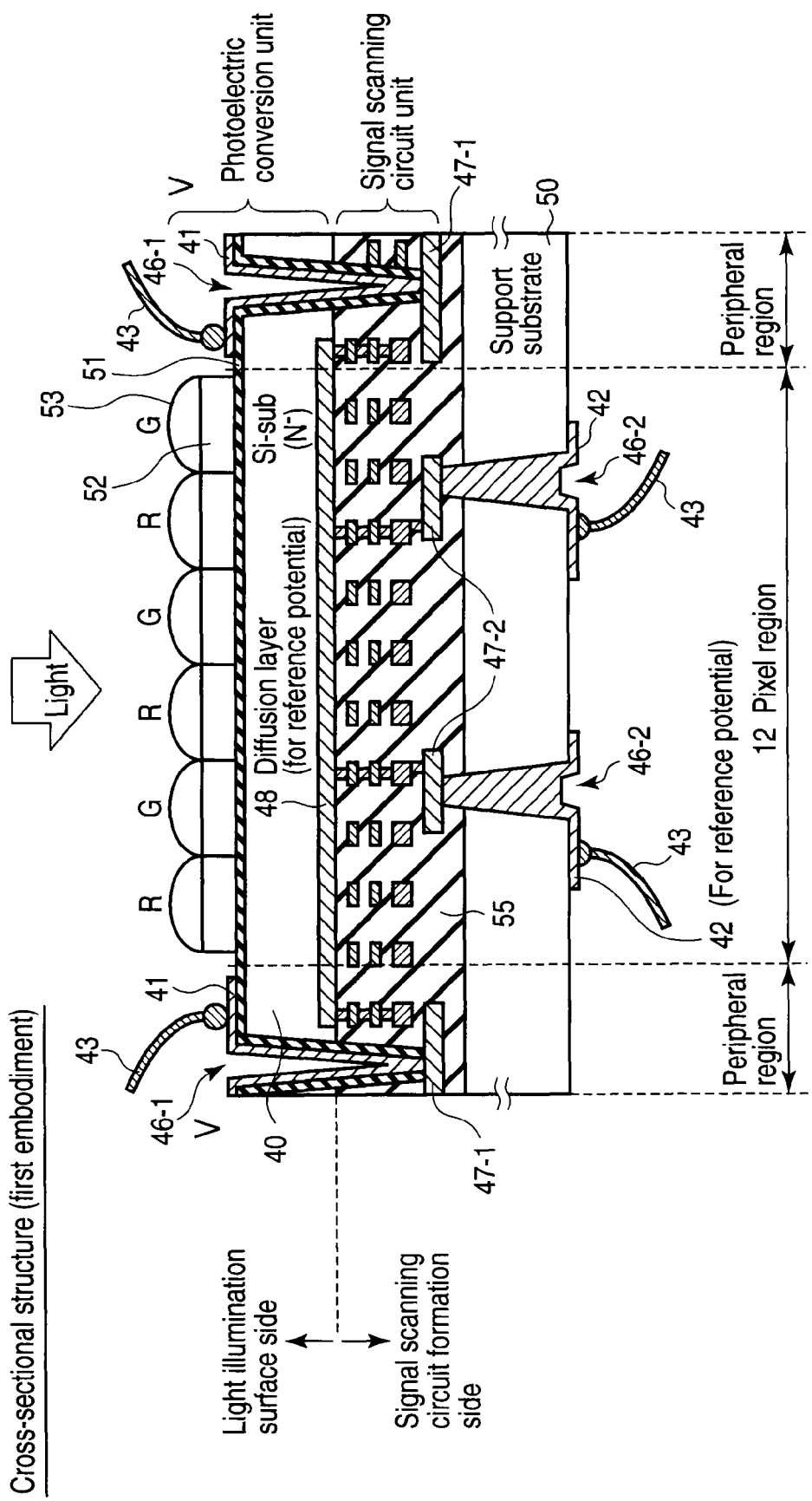
FIG. 5 is a cross-sectional view showing a cross-sectional structure example, taken along line V-V in FIG. 3 and FIG. 4.

Next, referring to FIG. 5, a description is given of a cross-sectional structure example of the solid-state imaging device according to the embodiment. The description is given by taking, as an example, a cross section along line V-V in FIG. 3 and FIG. 4.

As shown in FIG. 5, the unit pixel 1 is composed of a photoelectric conversion unit and a signal scanning circuit unit.

The photoelectric conversion unit includes a diffusion layer 48 to which the reference potential Vss is applied, an antireflection film 51, a color filter 52 and a micro-lens 53 on the surface of a semiconductor substrate (Si-sub) 40 which is formed of silicon on the light illumination surface side. As will be described later, the diffusion layer 48, to which the reference potential Vss is applied, is, for instance, a p-type diffusion layer of which a photodiode 2, which forms a signal charge accumulation region, is composed.

The signal scanning circuit unit includes, for instance, the above-described amplifying transistor 3 and a multilayer wiring layer, which are formed in an interlayer insulation film 55 that is provided on the surface of the semiconductor substrate 40 on the signal scanning circuit formation surface side.

In addition, a support substrate 50 is provided on the interlayer insulation film 55 on the side on which the signal scanning circuit unit is formed. A via 46-2 penetrates the support substrate 50 in order to form the second pad 42. The depiction of the details of the ratio of the thickness of the support substrate 50 is omitted in the Figure.

The first pad 41 is provided in a via 46-1 which penetrates the semiconductor substrate 40 and reaches a wiring layer 47-1 in the interlayer insulation film 55. A bonding wire 43 for electrical connection to the outside is provided on a ball land of the first pad 41.

The second pad 42 is provided in the via 46-2 which penetrates the support substrate 50 and reaches the wiring layer 47-2 in the interlayer insulation film 55. A bonding wire 43 for electrical connection to the outside is provided on a ball land of the second pad 42.

1-5. Plan-View Structure Example of Color Filter

Next, referring to FIG. 6, a description is given of a plan-view structure example of the color filter 52 which is included in the solid-state imaging device according to the present embodiment. FIG. 6 is a layout view showing how the color filter is disposed in order to acquire a color signal in the single-chip solid-state imaging device structure.

In FIG. 6, a pixel that is indicated by R is a pixel in which a color filter, which principally passes light of a red wavelength region, is disposed. A pixel that is indicated by G is a pixel in which a color filter, which principally passes light of a green wavelength region, is disposed. A pixel that is indicated by B is a pixel in which a color filter, which principally passes light of a blue wavelength region, is disposed.

In the present embodiment, a color filter arrangement, which is most frequently used as Bayer arrangement, is shown. As shown in FIG. 6, neighboring color filters (R, G, B) are arranged such that mutually different color signals are obtained in the row direction and column direction.

1-6. Structure Example of Unit Pixel

Figure 7:
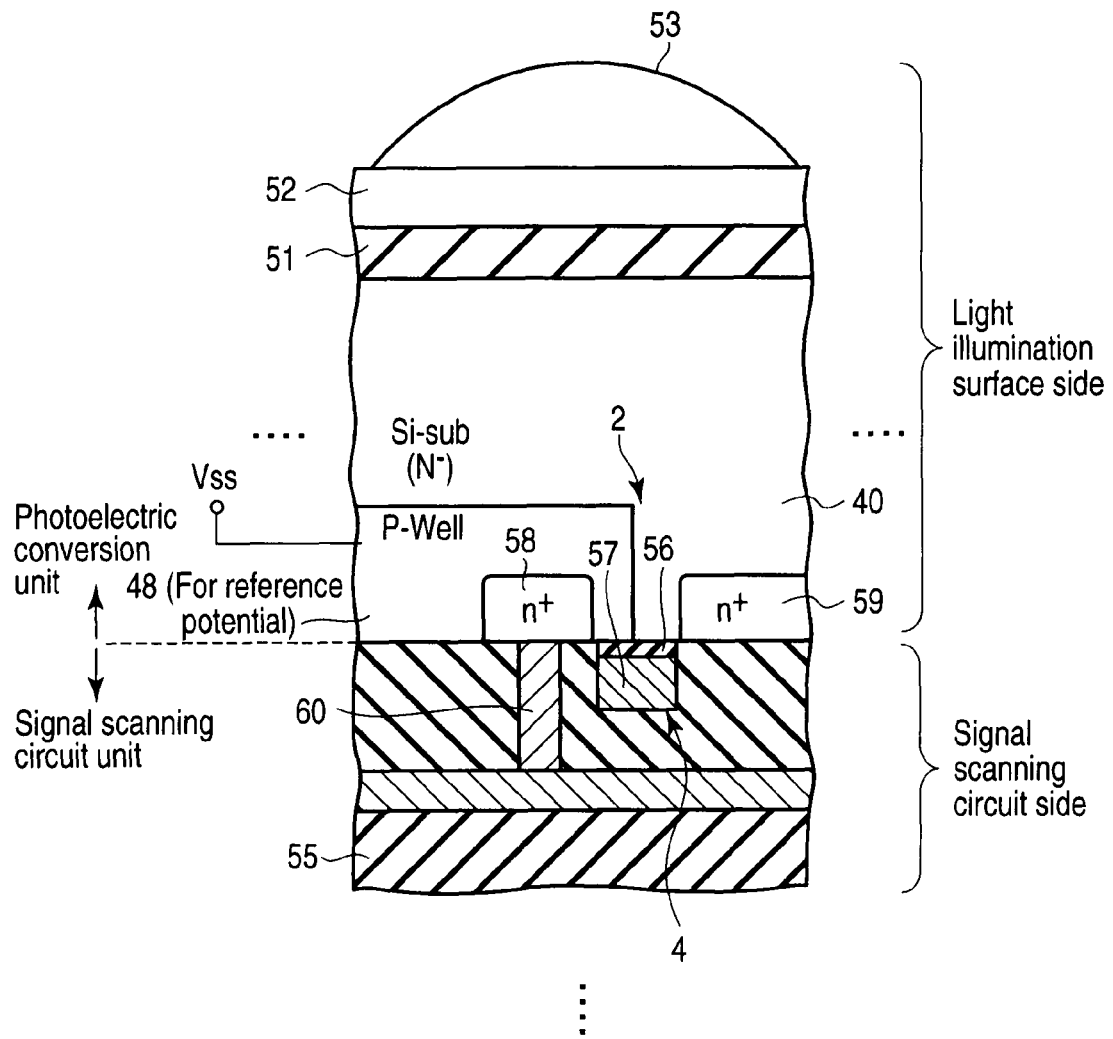
FIG. 7 is a cross-sectional view showing a cross-sectional structure example of a unit pixel according to the first embodiment.

Next, referring to FIG. 7, the structure example of the unit pixel 1, which is included in the solid-state imaging device according to the embodiment, is described in greater detail.

In the illustrated cross section, the unit pixel 1 includes a read-out transistor 4 which is provided on the surface of the silicon substrate 40, and a photodiode 2 which is provided in the silicon substrate 40. In the present embodiment, exemplification has been made of the case in which the silicon substrate is the n-type diffusion layer. However, the silicon substrate may be a p-type diffusion layer.

The read-out transistor 4 is composed of a gate insulation film 56 which is provided in the interlayer insulation film 55, a gate electrode 57 which is provided in the interlayer insulation film 55 on the gate insulation film 56, and a source 59 ($n^+$ diffusion layer) and a drain 58 ($n^+$ diffusion layer) which are provided, spaced apart, in the silicon substrate 40 in a manner to sandwich the gate electrode 57.

The photodiode 2 is composed of an $n^+$ diffusion layer that is the source 59, and a P-well layer 48 that is formed in the silicon substrate 40 in contact with the source 59 and forms a PN junction with the source 59. The P-well layer 48 is a diffusion layer which is electrically connected to the second pad 42 and is supplied with the reference potential Vss that is applied from the second pad 42.

The drain 58 is electrically connected to a multilayer wiring layer via a contact wiring layer 60 which is provided in the interlayer insulation film 55 on the drain 58. In accordance with an electric signal that is output from the multilayer wiring layer, the pixel of the unit pixel 1 is displayed. The other unit pixels have the same structure, so a detailed description thereof is omitted.

2. Manufacturing Method

Next, referring to FIG. 8 to FIG. 15, a description is given of the method of manufacturing the solid-state imaging device according to the embodiment.

Figure 8:
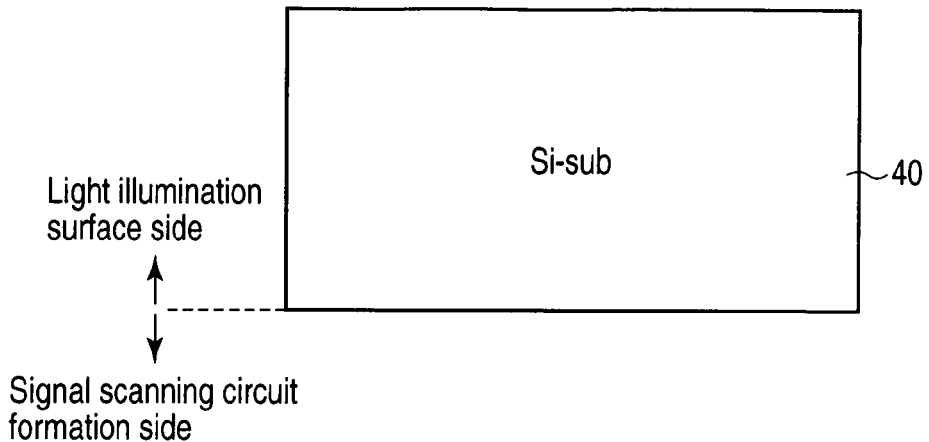
FIG. 8 is a cross-sectional view showing a fabrication step of the solid-state imaging device according to the first embodiment.

FIG. 8 shows a silicon substrate (Si-sub) 40 prior to processing.

Figure 9:
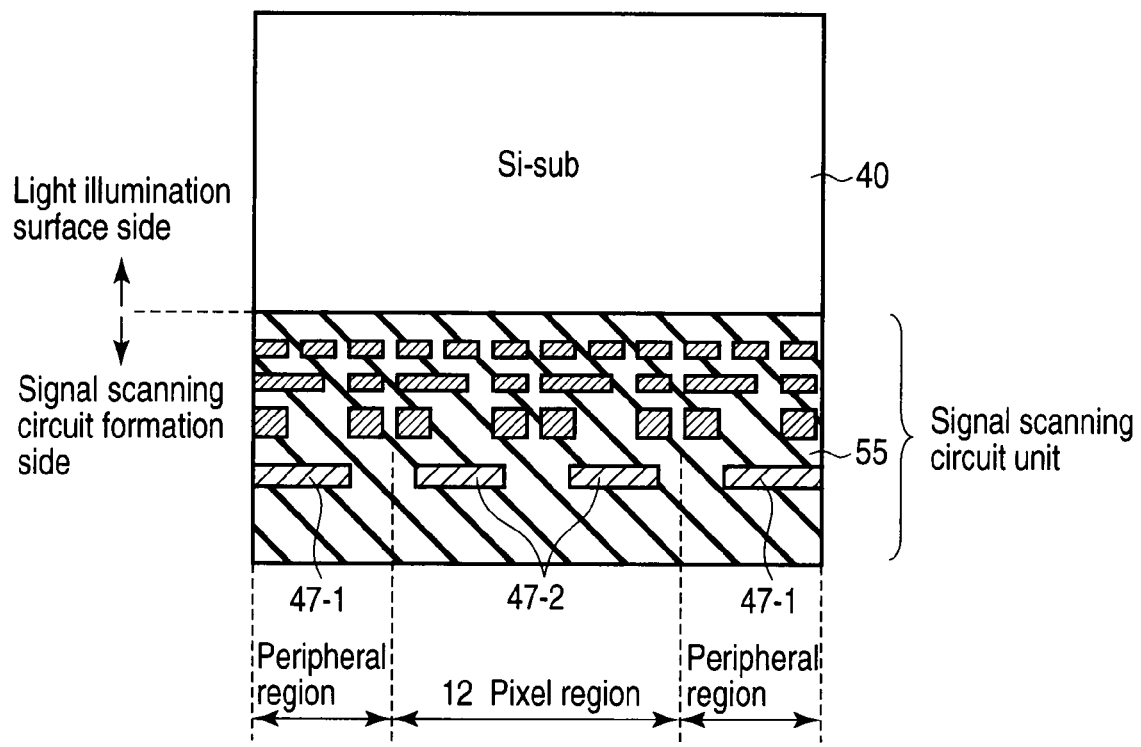
FIG. 9 is a cross-sectional view showing a fabrication step of the solid-state imaging device according to the first embodiment.

As shown in FIG. 9, a silicon oxide film, for instance, is formed by, e.g. CVD (Chemical Vapor Deposition), on the semiconductor substrate 40 on the signal scanning circuit formation side, and an interlayer insulation film 55 is formed. Subsequently, a Cu wiring layer, etc. are formed in the interlayer insulation film, and a multilayer wiring layer, which forms the signal scanning circuit unit, is formed. At this time, a wiring layer 47-1 to which the first pad 41 is connected is formed in the peripheral region, and, at the same time, a wiring layer 47-2 to which the second pad 42 is connected is formed in the pixel region 12, such that the wiring layer 47-1 and the wiring layer 47-2 are formed at the same depth.

Figure 10:
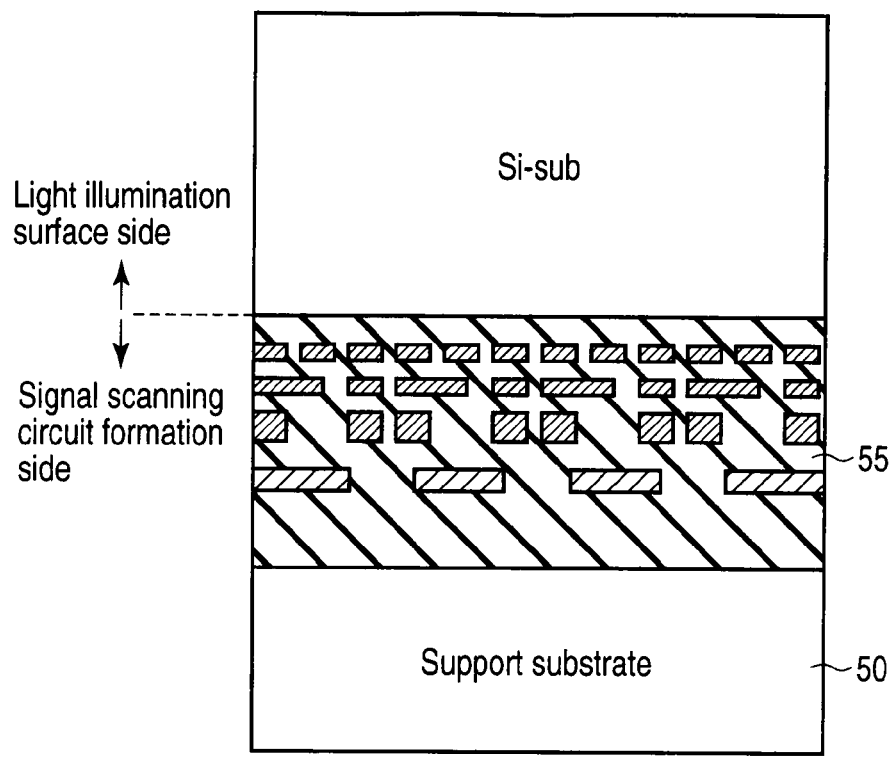
FIG. 10 is a cross-sectional view showing a fabrication step of the solid-state imaging device according to the first embodiment.

Subsequently, as shown in FIG. 10, a (first) support substrate 50 is bonded to the surface of the interlayer insulation film 55.

Figure 11:
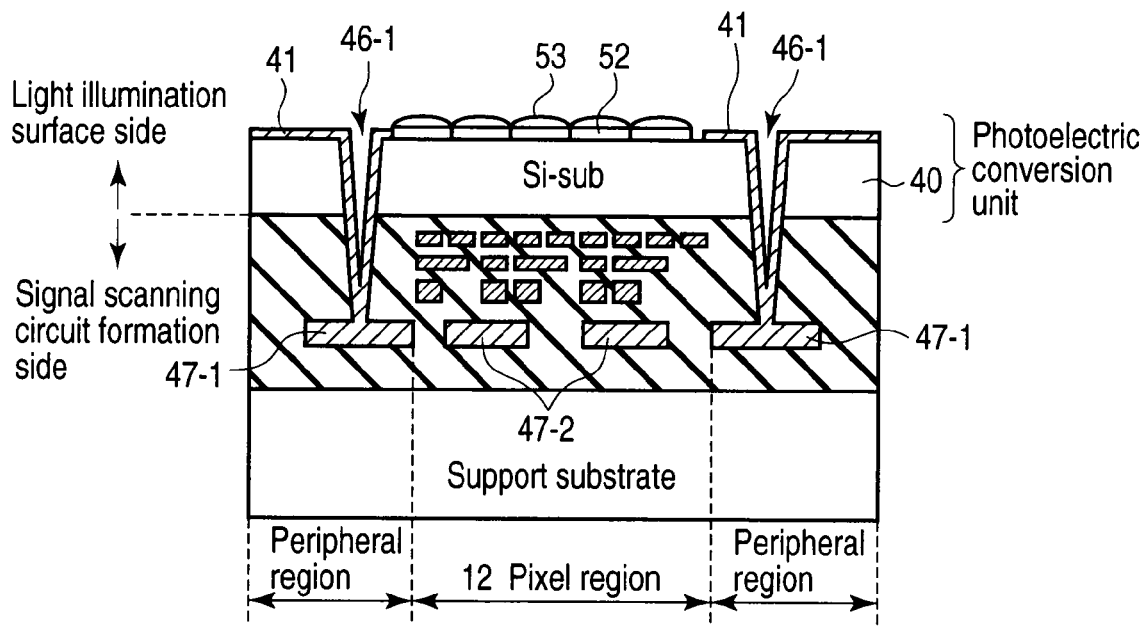
FIG. 11 is a cross-sectional view showing a fabrication step of the solid-state imaging device according to the first embodiment.

Then, as shown in FIG. 11, etching, such as RIE (Reactive Ion Etching), is performed on the surface of the silicon substrate 40 on the light-receiving surface side, thereby reducing the thickness of the silicon substrate 40. In the case of this example, in this step, the thickness of the silicon substrate 40 is reduced to, e.g. about 3 to 7 µm. Subsequently, an antireflection film 51 (not shown), a color filter 52 and a micro-lens 53 are formed.

Following the above, using RIE or the like, a first via 46-1 is formed so as to reach the wiring layer 47-1 of the signal scanning circuit unit from the surface of the light illumination surface side of the semiconductor substrate 40 in the peripheral region. Then, a metal layer of, e.g. Cu is formed by, e.g. CVD, from the inside of the first via 46-1 over the surface of the light illumination surface side of the semiconductor substrate 40, and a first pad 41 is formed.

Figure 12:
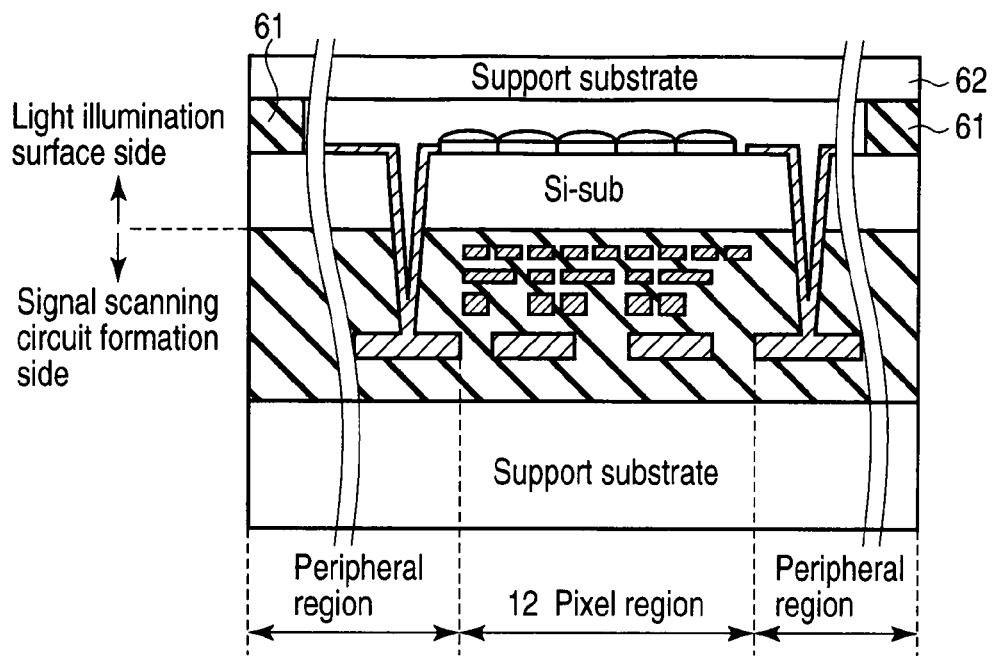
FIG. 12 is a cross-sectional view showing a fabrication step of the solid-state imaging device according to the first embodiment.

Subsequently, as shown in FIG. 12, a coupling material 61 is formed at an endmost part of the peripheral region on the surface of the light illumination surface side of the semiconductor substrate 40. Then, a (second) support substrate 62 is bonded to the coupling material 61.

Figure 13:
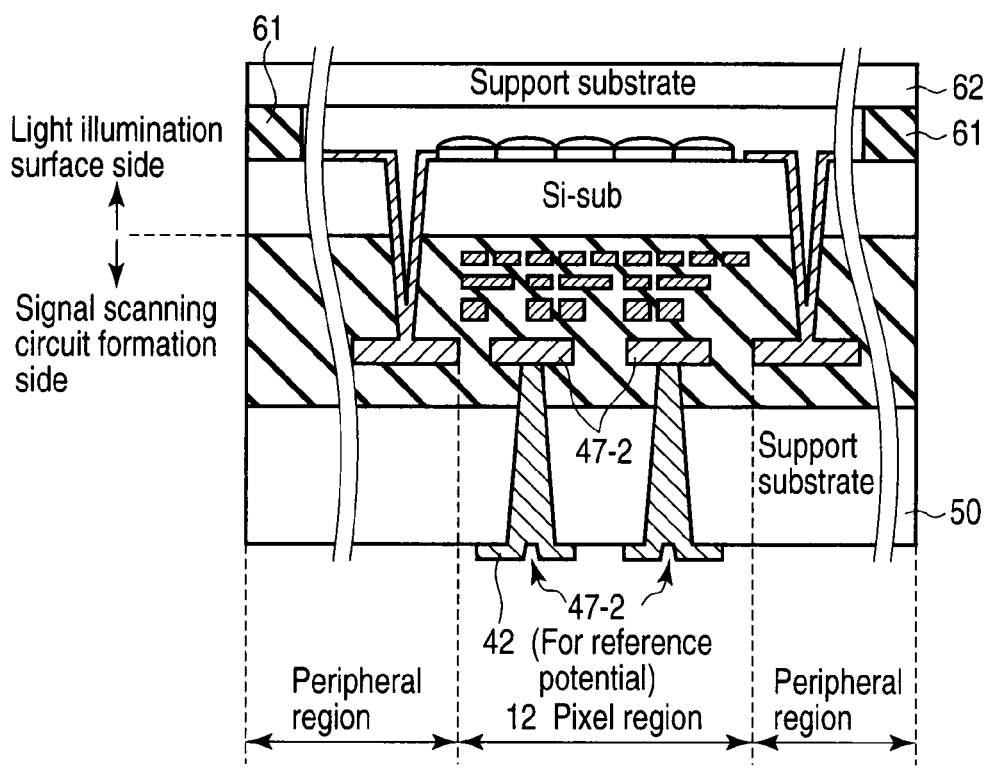
FIG. 13 is a cross-sectional view showing a fabrication step of the solid-state imaging device according to the first embodiment.

Thereafter, as shown in FIG. 13, using RIE, for example, only in the pixel region other than the peripheral region, a second via 46-2 is formed so as to reach the wiring layer 47-2 of the signal scanning circuit unit in the interlayer insulation film 55 from the surface of the first support substrate 50. Then, a metal layer of, e.g. Cu is formed by, e.g. CVD, from the second via 46-2 over the surface of the signal scanning circuit unit side of the semiconductor substrate 40, and a second pad 42 is formed.

Subsequently, as shown in FIG. 14, the (second) support substrate 62 and coupling material 61 are successively removed.

Then, as shown in FIG. 15, using an LSI fabrication process, bonding wires 43 for electrical connection to the outside are formed on ball lands of the first and second pads 41 and 42.

3. Advantageous Effects of the First Embodiment

According to the solid-state imaging device of the present embodiment and the manufacturing method thereof, at least the following advantageous effects (1) and (2) can be obtained.

(1) The occurrence of shading can be prevented and the quality of a reproduced screen can be improved.

When the pixel array (pixel region) 12 is driven, the signal scanning circuit that is disposed in the unit pixel 1 is driven. Consequently, various potential variations occur. For example, a driving pulse is applied to the gate, or a signal line potential varies in accordance with the intensity of incident light which becomes an input signal.

Figure 25:
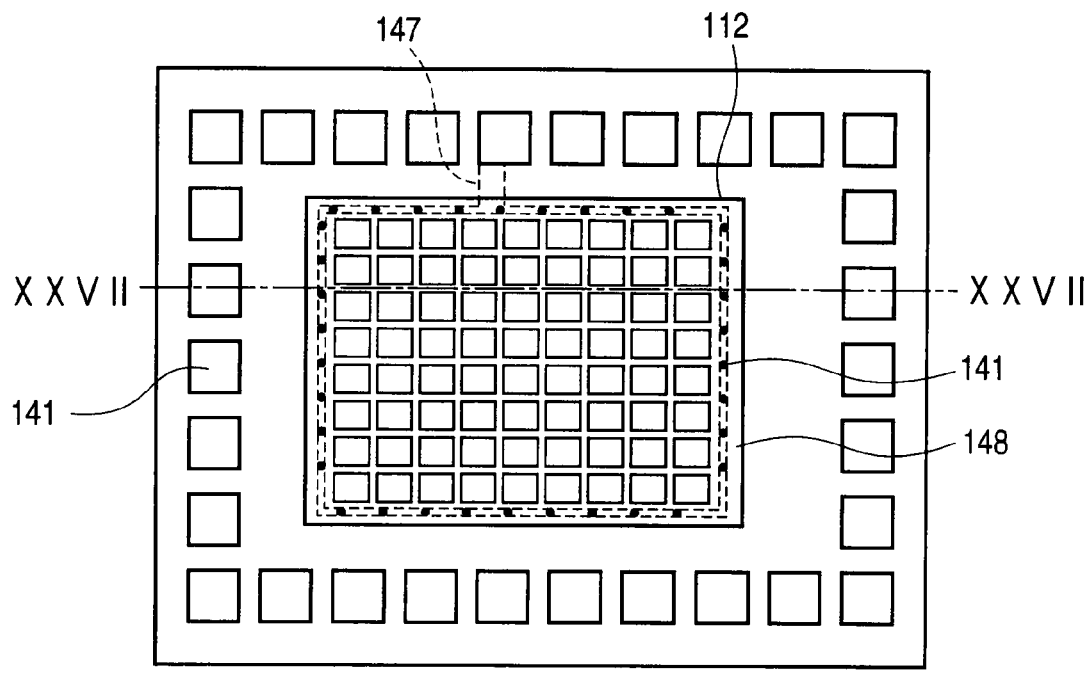
FIG. 25 is a plan view showing a plan-view structure example (light illumination surface side) of a solid-state imaging device according to a comparative example.
Figure 26:
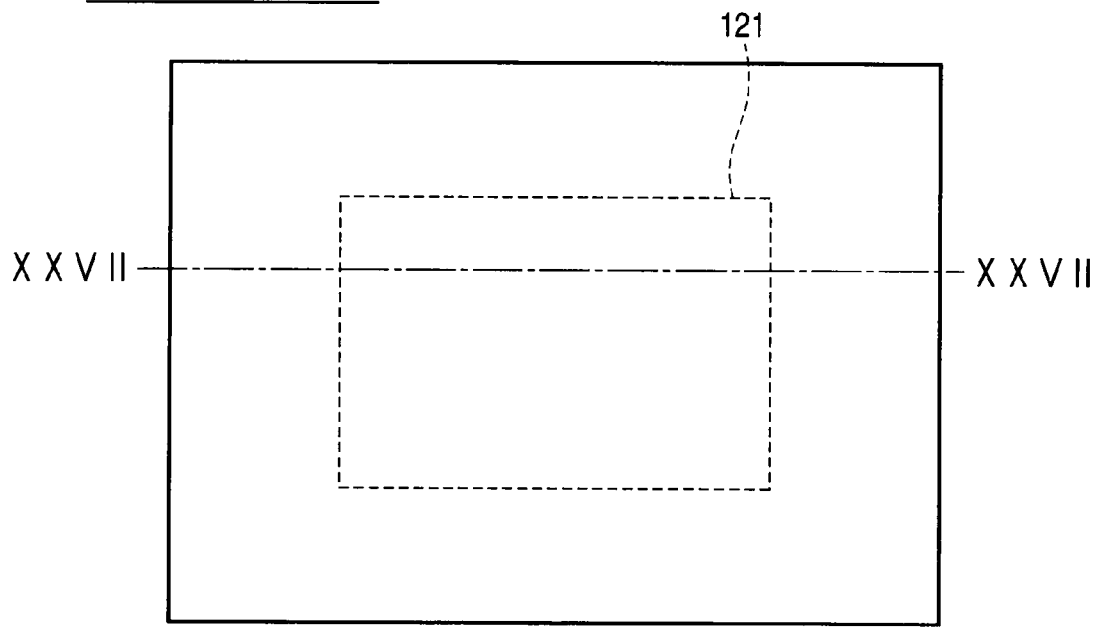
FIG. 26 is a plan view showing a plan-view structure example (signal scanning circuit formation surface side) of the solid-state imaging device according to the comparative example.
Figure 27:
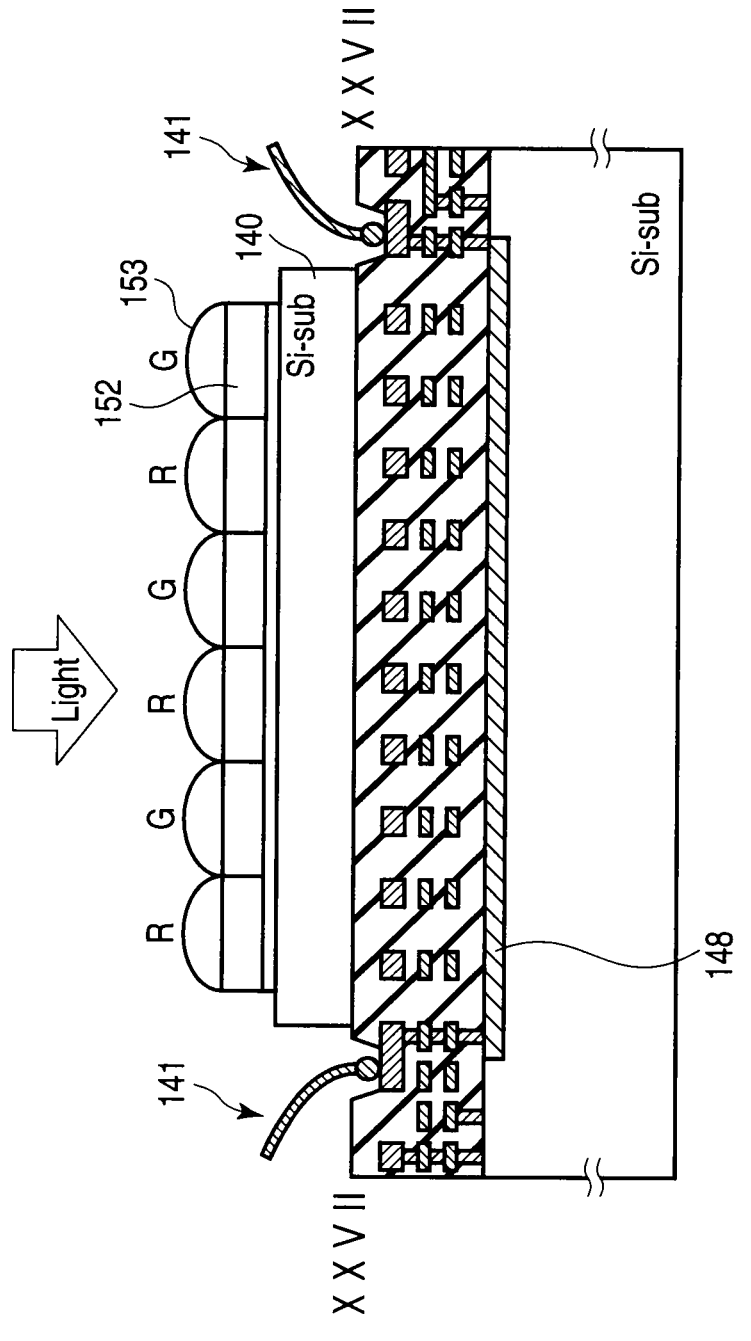
FIG. 27 is a cross-sectional view showing a cross-sectional structure example, taken along line XXVII-XXVII in FIG. 25 and FIG. 26.

In this case, if the structure of a comparative example, which will be described later with reference to FIG. 25 to FIG. 27, is adopted, the reference potential Vss is applied and input from a pad 141 that is disposed on the peripheral region on the light illumination surface side alone. Thus, the reference potential Vss is not directly applied to the unit pixel, but to the outer periphery of a pixel region (pixel array) 112. Then, when a potential variation occurs in the unit pixel 1, as described above, the reference potential Vss temporarily varies due to coupling capacitance between the gate and the diffusion layer (e.g. diffusion layer 148) to which the reference potential is applied, or due to coupling capacitance between the diffusion layer to which a signal potential is applied and the diffusion layer (e.g. diffusion layer 148) to which the reference potential is applied.

In this case, in the central part of the pixel array, the velocity τ of this variation with time is approximately expressed by the following equation (1), mainly on the basis of a resistance R per unit pixel of the diffusion layer to which the reference potential Vss is applied, and a capacitance C of the unit pixel that is continuous with the resistance R:

$$\tau = R*C/2 \quad (1)$$

As expressed by the above equation (1), a difference occurs in reference potential during the period of approximately τ between the end part of the pixel region 112 and the central part of the pixel array 112. In such a case, a potential of a floating diffusion layer, which executes signal detection in the unit pixel 1, varies between the end part of the pixel region 112 and the central part thereof, and this variation leads directly to a difference in output signal. As a result, a difference in signal amount occurs between the end portion of the pixel array 112 and the central part of the pixel array 112 on the reproduced screen, and, even in the case where a subject with a uniform picture pattern is photographed, a pseudo-signal called "shading" occurs as a non-uniform picture pattern on the reproduced screen. If shading occurs, there is a tendency that the shading becomes noise, and the image quality of the reproduced screen is considerably degraded.

However, as has been described above, the solid-state imaging device according to the present first embodiment is the back-surface illumination type solid-state imaging device. The pixel region 12 and the driving circuit region 14 are provided on the semiconductor substrate 40. The pixel region 12 is configured such that the photoelectric conversion unit and the signal scanning circuit unit are included and the matrix of unit pixels is disposed. The driving circuit region 14 is configured such that the driving circuit for driving the signal scanning circuit unit is disposed. The light receiving surface is provided on a substrate surface which is opposite to the substrate surface on which the signal scanning circuit unit is formed. Further, the solid-state imaging device of the first embodiment includes the first pads 41 which are provided on the semiconductor substrate 40 on the light receiving surface side, and the second pads 42 which are provided on the signal scanning circuit unit formation side in order to apply the reference potential Vss, and are disposed at only positions overlapping the pixel region 12 in the thickness direction of the semiconductor substrate 40.

The second pads 42 for applying the reference potential are disposed at only positions overlapping the pixel region 12 in the thickness direction of the semiconductor substrate 40. Therefore, even in the case of the back-surface illumination type solid-state imaging device in which the above-described potential variation occurs in the pixel region 12, the reference potential Vss can be uniformly supplied to each unit pixel 1 in the pixel region 12. As a result, advantageously, the occurrence of shading can be prevented, the occurrence of a pseudo-signal can be suppressed, and the image quality of the reproduced screen can be improved.

(2) Even in the case where a subject with a high luminance is imaged, the occurrence of a pseudo-signal can be prevented between pixels corresponding to the subject with high luminance and other pixels, non-uniformity in picture pattern can be prevented on the reproduced screen, and the image quality of the reproduced screen can be improved.

In a case where a subject with a very high luminance is imaged, photoelectrons, which are generated in the semiconductor substrate 40 by photoelectric conversion, flow into a power supply terminal in the unit pixel 1, and the photoelectrons flow out, as an electric current, to the outside of the imaging element via the contact and wiring in the multilayer wiring. In the case where the luminance of the subject is very high and accordingly the discharge current value Ie is very high, the potential difference ΔV is expressed by the following equation (2), on the basis of the contact resistance RC and wiring resistance Rl:

$$\Delta V = (RC+Rl)*Ie \quad (2)$$

As expressed by equation (2), the potential difference ΔV is added to the power supply potential of the unit pixel 1 which images the subject with high luminance. In this case, if the structure of the comparative example, which will be described later with reference to FIG. 25 to FIG. 27, is adopted, pads 141 for reference potential are not distributively provided on the upper and lower surfaces, and the reference potential Vss cannot distributively be applied to the pixel region 112 and the other region, resulting in a variation in signal output. Thus, a pseudo-signal occurs in a pixel which shares the power supply wiring with the pixel which images the subject with high luminance. Consequently, a picture pattern becomes non-uniform on the reproduced screen, and the non-uniformity becomes noise and considerably degrades the image quality of the reproduced screen.

However, as described above, in the solid-state imaging device according to the first embodiment, the second pads 42 for applying the reference potential (Vss) are disposed at only positions overlapping the pixel region 12 in the thickness direction of the semiconductor substrate 40. Therefore, even in the case of the back-surface illumination type solid-state imaging device in which the above-described potential variation occurs in the pixel region 12 due to the above-described potential difference ΔV which has occurred since the subject with very high luminance is imaged, the reference potential Vss can be uniformly supplied to each unit pixel 1 in the pixel region 12. As a result, advantageously, even when the subject with high luminance is imaged, the occurrence of a pseudo-signal can be prevented between pixels corresponding to the subject with high luminance and other pixels, non-uniformity in picture pattern can be prevented on the reproduced screen, and the image quality of the reproduced screen can be improved.

[Modification 1 (an Example in Which Ball Lands are Provided on one Surface Side)]

Figure 16:
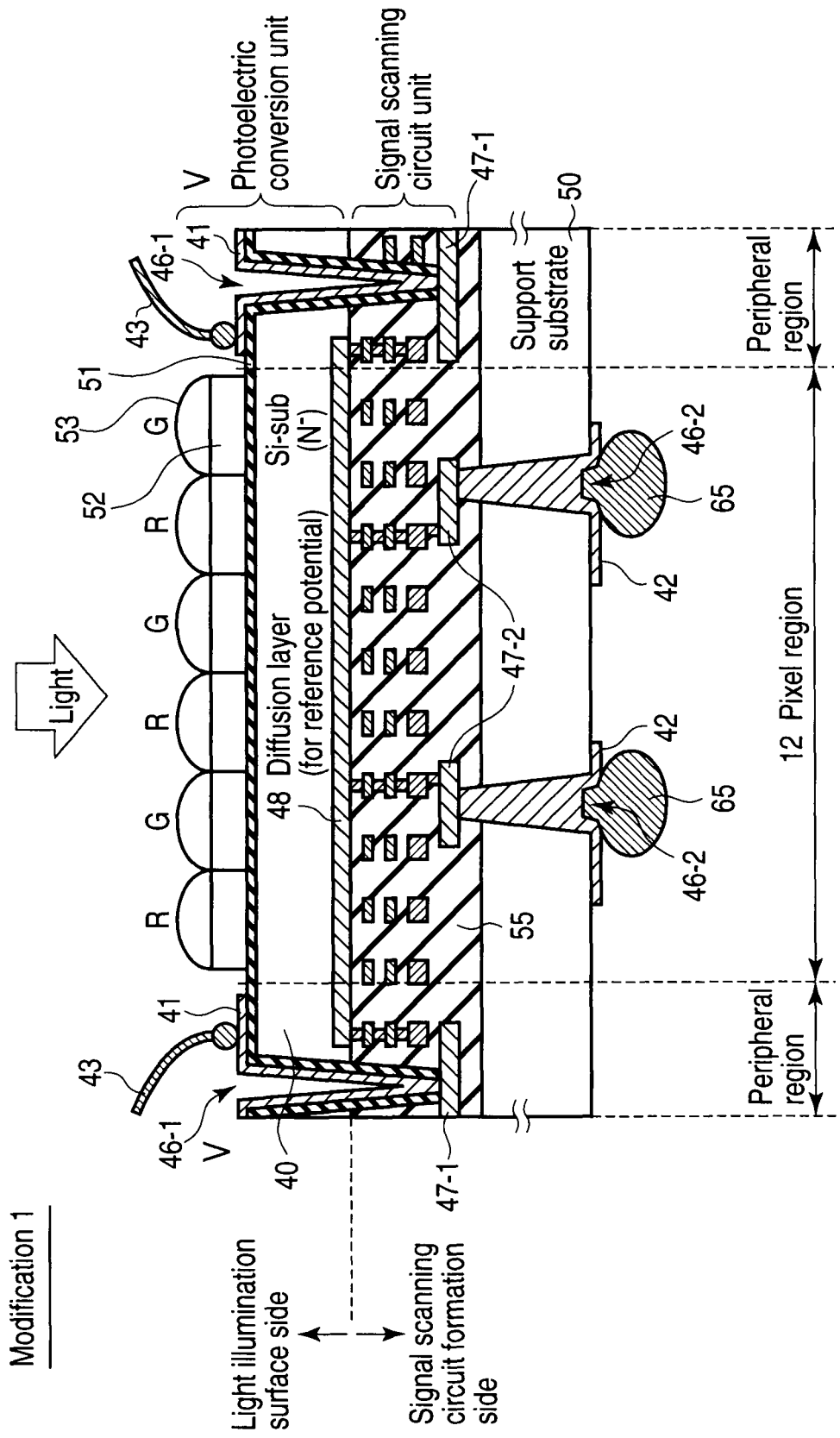
FIG. 16 is a cross-sectional view showing a cross-sectional structure example of a solid-state imaging device according to Modification 1.

Next, referring to FIG. 16, a solid-state imaging device according to Modification 1 is described. Modification 1 relates to an example in which ball lands are provided on the signal scanning circuit formation surface side. A detailed description of the parts common to those of the above-described first embodiment is omitted here.

As shown in FIG. 16, the solid-state imaging device according to Modification 1 differs from the solid-state imaging device of the first embodiment in that solder balls 65 are provided on the second pads 42 on the signal scanning circuit formation surface side.

The manufacturing method, etc. in Modification 1 are substantially the same as in the first embodiment, so a detailed description thereof is omitted.

According to Modification 1, at least the same advantageous effects (1) and (2) as described above are obtained. Modification 1 is applicable, where necessary.

[Modification 2 (an Example in Which Ball Lands are Provided on Both Surface Sides)]

Figure 17:
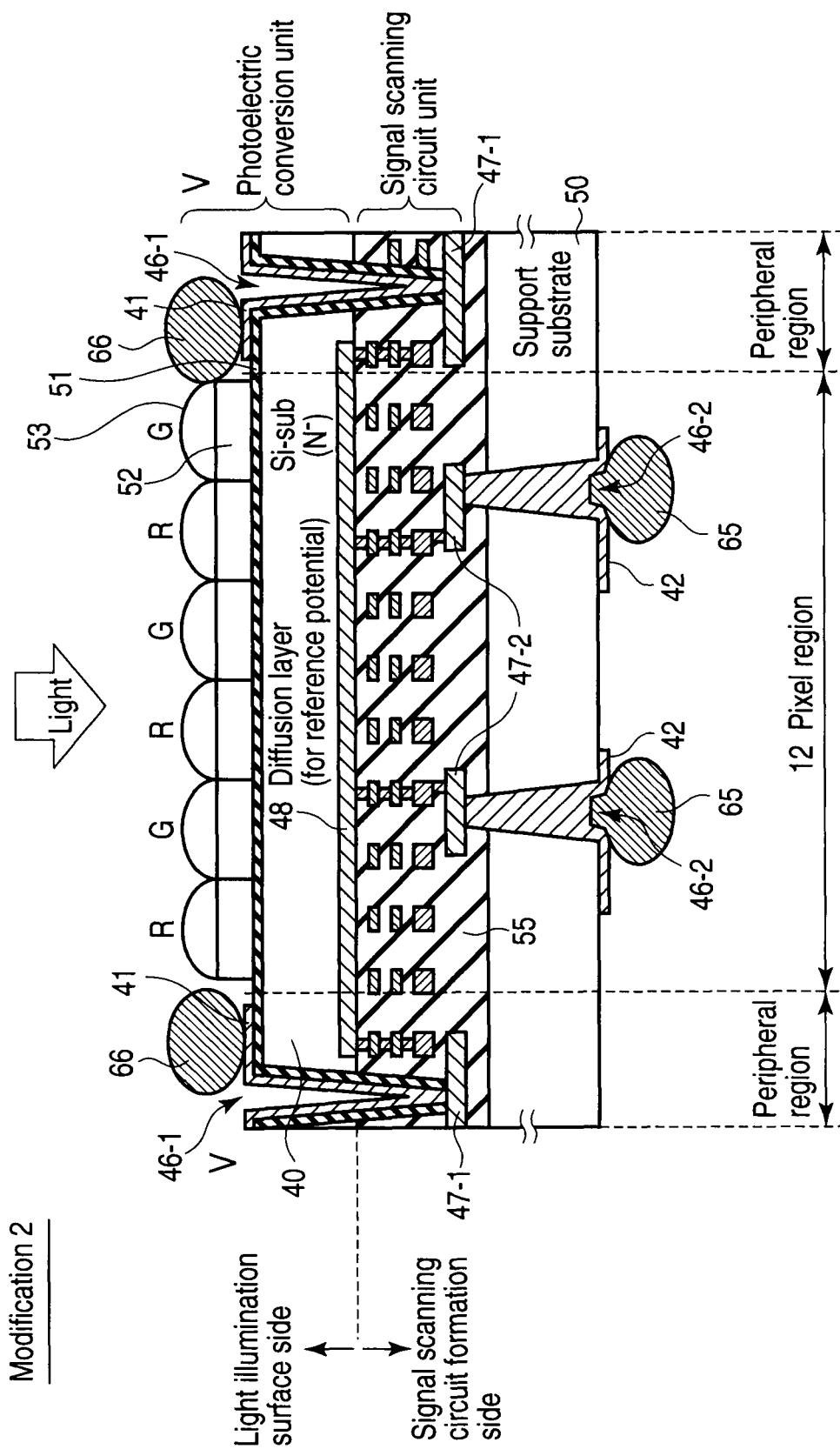
FIG. 17 is a cross-sectional view showing a cross-sectional structure example of a solid-state imaging device according to Modification 2.

Next, referring to FIG. 17, a solid-state imaging device according to Modification 2 is described. Modification 2 relates to an example in which ball lands are provided on both the light illumination surface side and the signal scanning circuit formation surface side. A detailed description of the parts common to those of the above-described first embodiment is omitted here.

As shown in FIG. 17, the solid-state imaging device according to Modification 2 differs from the solid-state imaging device of the first embodiment in that solder balls 65 and 66 are provided on the first pads 41 on the light illumination surface side and on the second pads 42 on the signal scanning circuit formation surface side.

The manufacturing method, etc. in Modification 2 are substantially the same as in the first embodiment, so a detailed description thereof is omitted.

According to Modification 2, at least the same advantageous effects (1) and (2) as described above are obtained. Modification 2 is applicable, where necessary.

Second Embodiment Modification 2

Another Layout Example of the Diffusion Layer for Reference Potential

Figure 18:
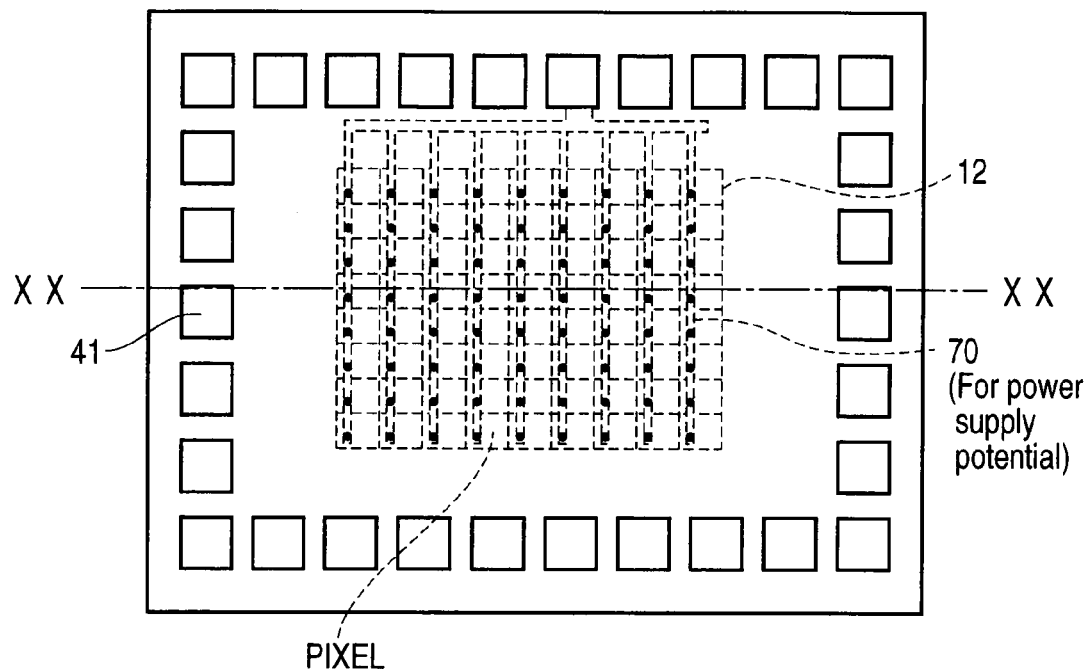
FIG. 18 is a plan view showing a plan-view structure example (light illumination surface side) of a solid-state imaging device according to a second embodiment of the invention.
Figure 19:
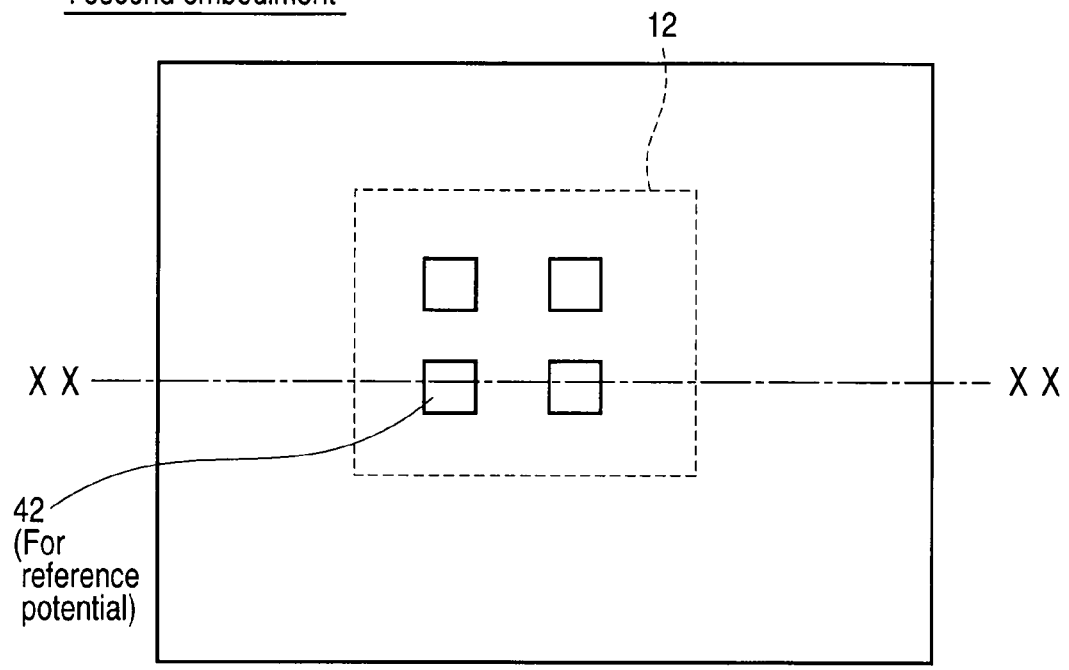
FIG. 19 is a plan view showing a plan-view structure example (signal scanning circuit formation surface side) of the solid-state imaging device according to the second embodiment.
Figure 20:
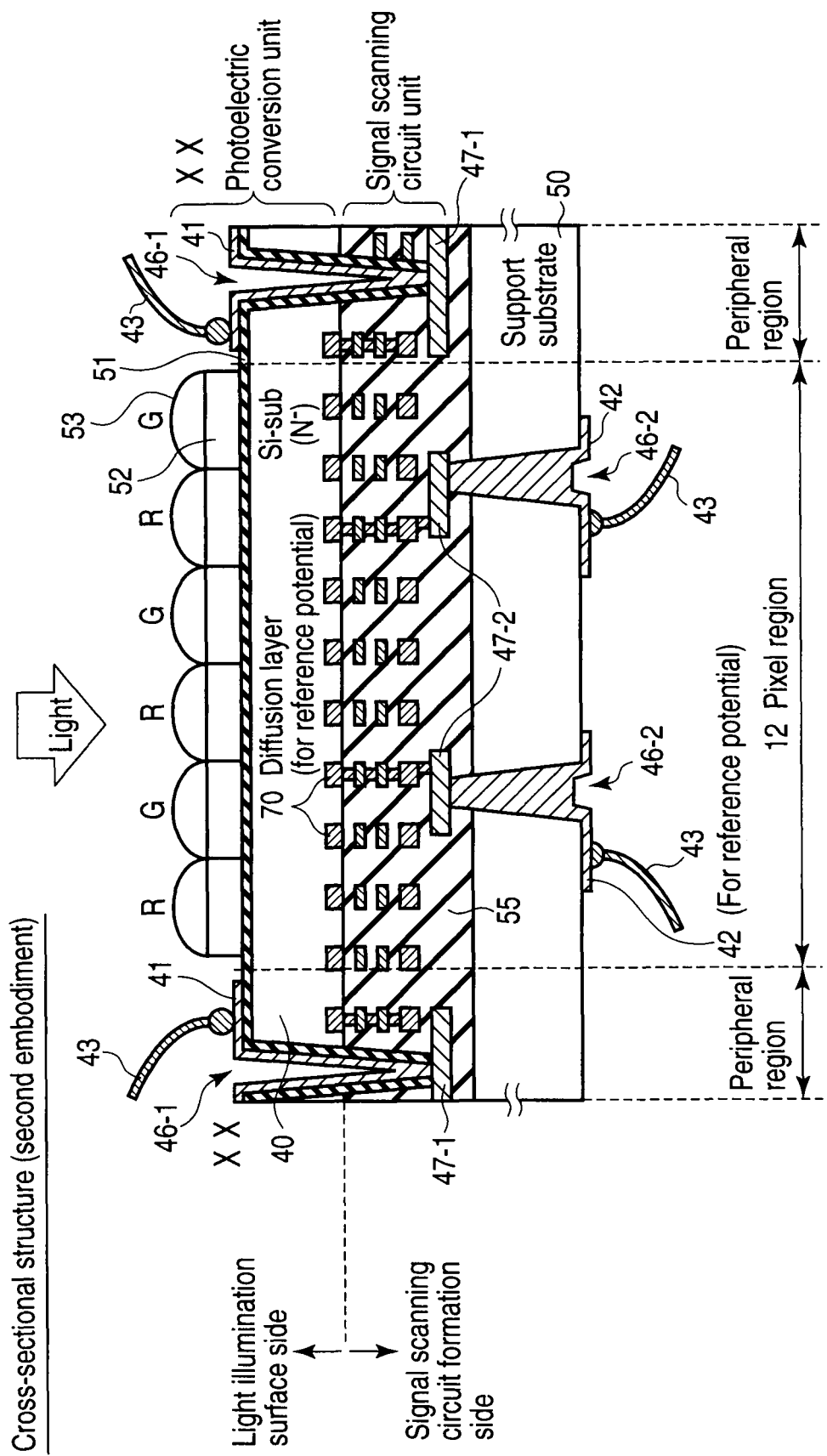
FIG. 20 is a cross-sectional view showing a cross-sectional structure example, taken along line XX-XX in FIG. 18 and FIG. 19.

Next, referring to FIG. 18 to FIG. 20, a solid-state imaging device according to a second embodiment of the invention is described. The second embodiment relates to another example of the plan-view layout of the diffusion layer for reference potential. A detailed description of the parts common to those of the above-described first embodiment is omitted here.

As shown in FIG. 18, the solid-state imaging device according to the second embodiment differs from the solid-state imaging device of the first embodiment in that a diffusion layer 70 having a comb-shaped plan-view layout, to which the reference potential Vss, etc. is applied from the second pads 42, is provided. As shown in FIG. 20, the diffusion layer 70 is provided for each unit pixel 1 on the interlayer insulation film 50. For example, a power supply voltage Vdd (or Vcc), instead of the reference potential Vss, may be applied to the diffusion layer 70.

The manufacturing method, etc. in the second embodiment are substantially the same as in the first embodiment, so a detailed description thereof is omitted.

According to the solid-state imaging device of the second embodiment and the manufacturing method thereof, the same advantageous effects (1) and (2) as described above are obtained. The second embodiment is applicable, where necessary.

[Modification 3 (an Example in Which Ball Lands are Provided on Both Surface Sides)]

Figure 21:
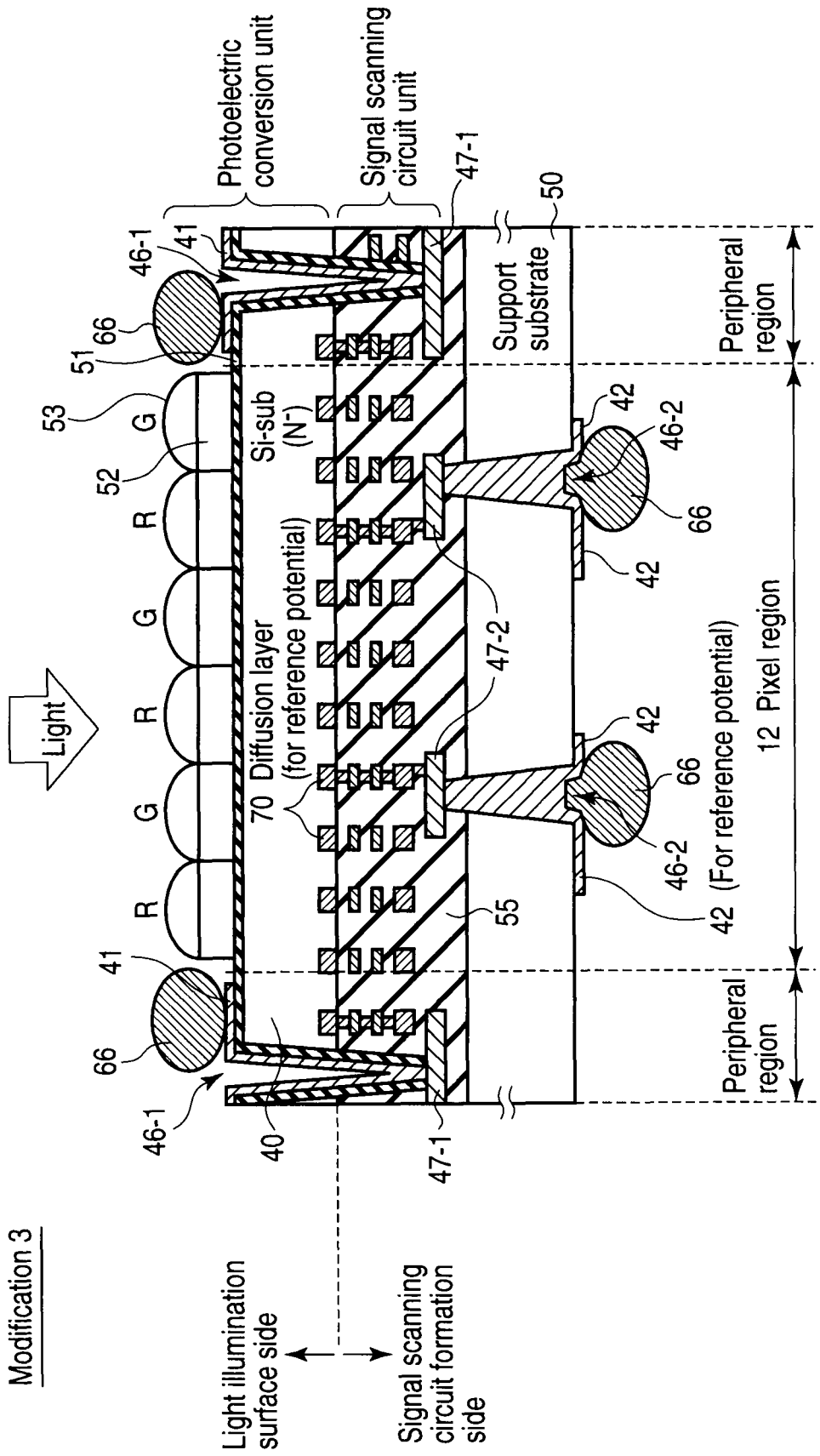
FIG. 21 is a cross-sectional view showing a cross-sectional structure example of a solid-state imaging device according to Modification 3.

Next, referring to FIG. 21, a solid-state imaging device according to Modification 3 is described. Modification 3 relates to an example in which ball lands are provided on both the light illumination surface side and the signal scanning circuit formation surface side in the structure of the second embodiment. A detailed description of the parts common to those of the above-described second embodiment is omitted here.

As shown in FIG. 21, the solid-state imaging device according to Modification 3 differs from the solid-state imaging device of the second embodiment in that solder balls 66 are provided on the first pads 41 on the light illumination surface side and on the second pads 42 on the signal scanning circuit formation surface side.

The manufacturing method, etc. in Modification 3 are substantially the same as in the first embodiment, so a detailed description thereof is omitted.

According to Modification 3, at least the same advantageous effects (1) and (2) as described above are obtained. Modification 3 is applicable, where necessary.

Third Embodiment

Two Diffusion Layers are Provided in the Same Layer Level

Figure 22:
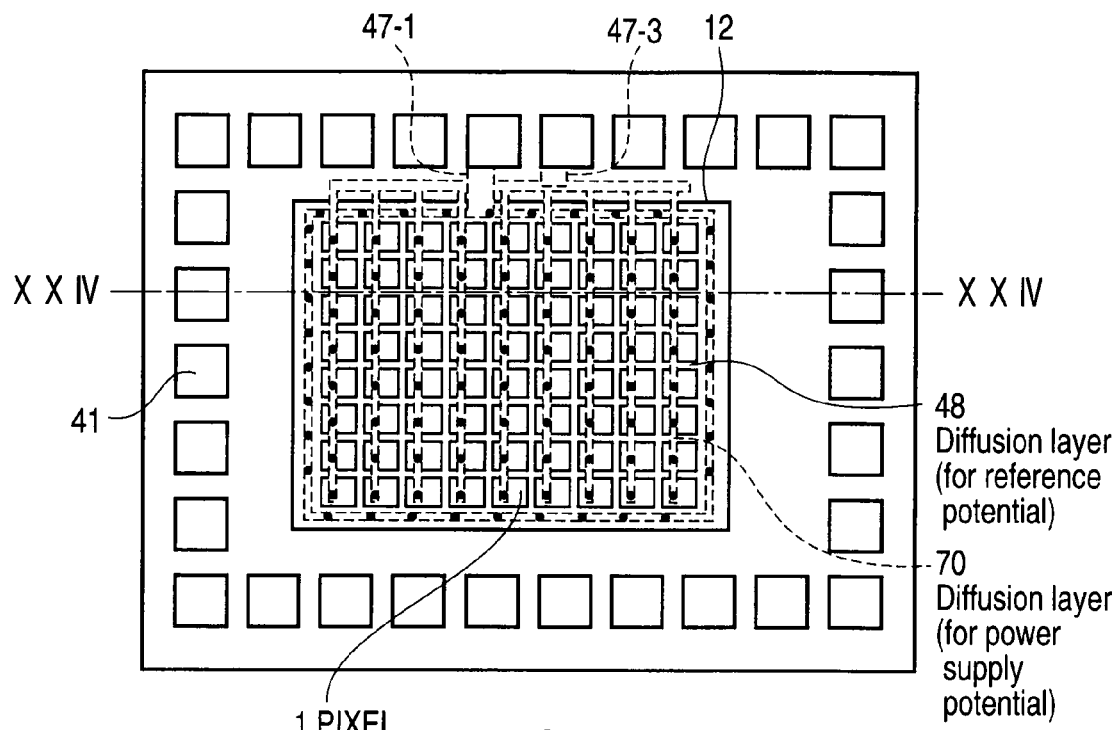
FIG. 22 is a plan view showing a plan-view structure example (light illumination surface side) of a solid-state imaging device according to a third embodiment of the invention.
Figure 23:
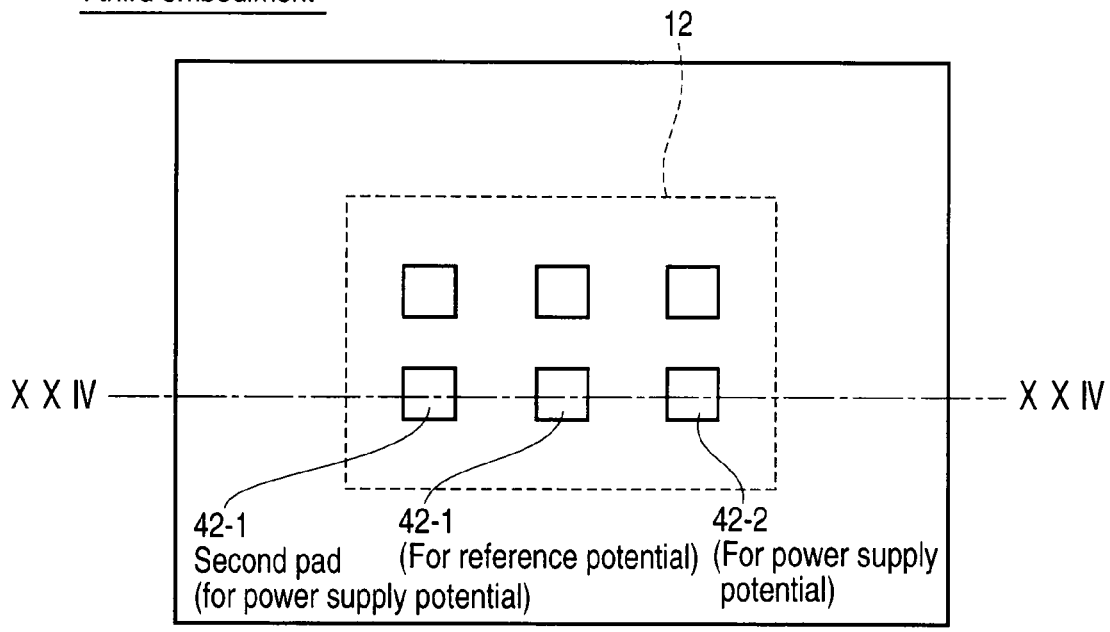
FIG. 23 is a plan view showing a plan-view structure example (signal scanning circuit formation surface side) of the solid-state imaging device according to the third embodiment.
Figure 24:
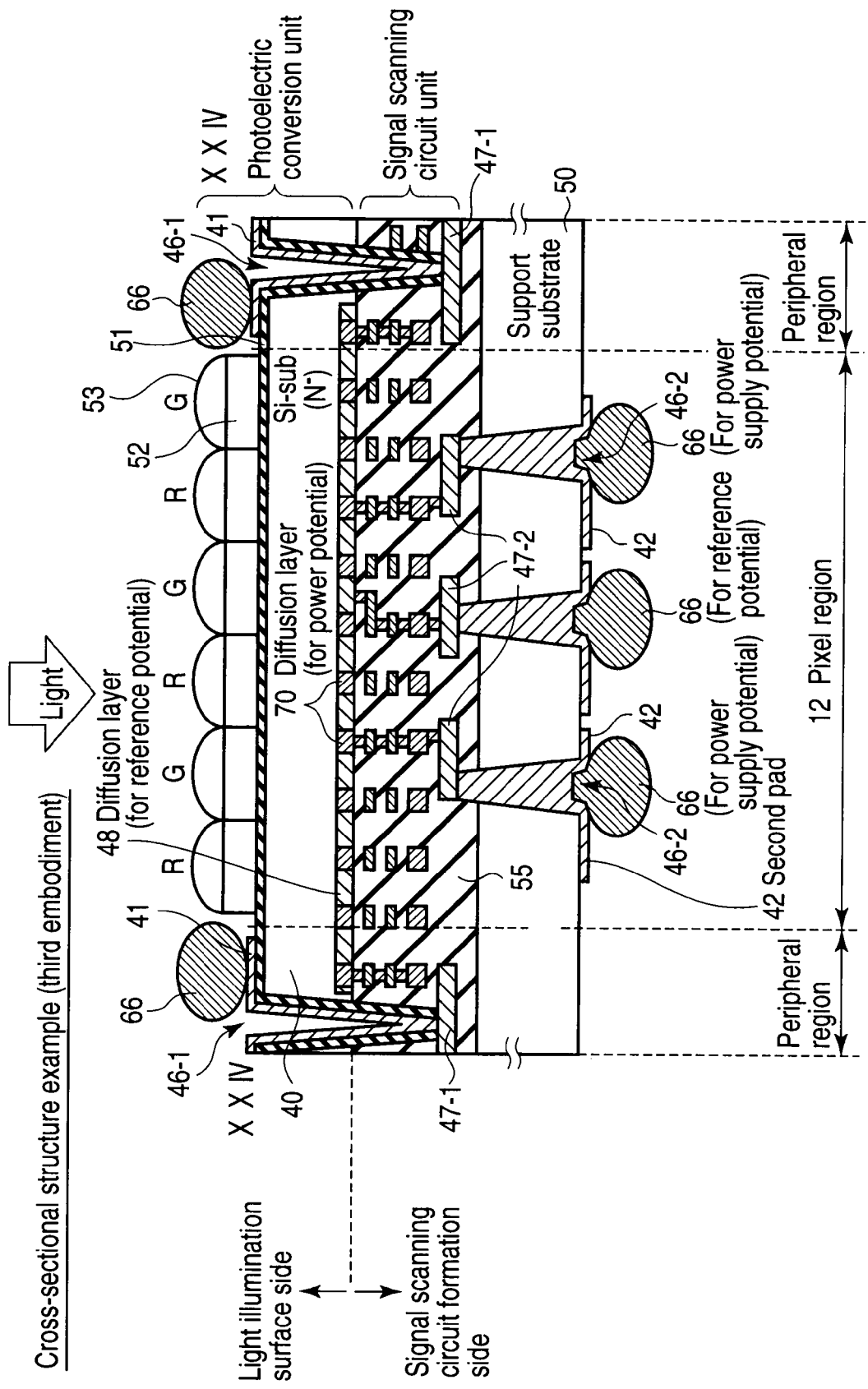
FIG. 24 is a cross-sectional view showing a cross-sectional structure example, taken along line XXIV-XXIV in FIG. 22 and FIG. 23.

Next, referring to FIG. 22 to FIG. 24, a solid-state imaging device according to a third embodiment of the invention is described. The third embodiment relates to an example in which two diffusion layers 48 and 70 are provided in the same layer level. A detailed description of the parts common to those of the above-described first embodiment is omitted here.

As shown in FIG. 22 to FIG. 24, the solid-state imaging device according to the third embodiment differs from the solid-state imaging device of the first embodiment in that two diffusion layers 48 and 70 are provided in the same layer level (at the same depth) on the interlayer insulation film 50. The reference potential Vss is applied to the diffusion layer 70 from second pads 42-1. The power supply potential Vdd (or Vcc) is applied to the diffusion layer 48 from second pads 42-2.

The manufacturing method, etc. in the third embodiment are substantially the same as in the first embodiment, so a detailed description thereof is omitted.

According to the above-described solid-state imaging device of the third embodiment, the same advantageous effects (1) and (2) as described above are obtained. The third embodiment is applicable, where necessary.

Comparative Example

An Example in which Pads for Reference Potential are not Distributively Provided on the Upper and Lower Surfaces Next, for the purpose of comparison with the solid-state imaging devices according to the above-described embodiments and modifications, a description is given of a solid-state imaging device according to a comparative example with reference to FIG. 25 to FIG. 27. The comparative example relates to an example in which pads for reference potential (Vss) are not distributively provided on the upper and lower surfaces. A detailed description of the parts common to those of the above-described first embodiment is omitted here.

As shown in FIG. 25 to FIG. 27, in the solid-state imaging device according to the present comparative example, pads 141 for the reference potential (Vss) are disposed only on the peripheral region on the light illumination surface side. As shown in FIG. 26, the pads 141 for the reference potential are not disposed on the signal scanning circuit formation surface side. In the structure of the comparative example, as described above, the pads 141 for the reference potential are not distributively provided on the upper and lower surfaces. Thus, the reference potential Vss cannot distributively be applied to the pixel region 112 and to the other region.

To be more specific, the reference potential Vss is applied and input from the pad 141 that is disposed on the peripheral region on the light illumination surface side alone. Thus, the reference potential Vss is not directly applied to the unit pixel, but to the outer periphery of the pixel region (pixel array) 112. Then, when a potential variation occurs in the unit pixel 1, as described above, the reference potential Vss temporarily varies due to coupling capacitance between the gate and the diffusion layer (e.g. diffusion layer 148) to which the reference potential Vss is applied, or due to coupling capacitance between the diffusion layer to which a signal potential is applied and the diffusion layer (e.g. diffusion layer 148) to which the reference potential Vss is applied.

As expressed by the above-described equation (1), a difference occurs in reference potential during the period of approximately τ between the end part of the pixel region 112 and the central part of the pixel array 112. In such a case, a potential of a floating diffusion layer, which executes signal detection in the unit pixel 1, varies between the end part of the pixel region 112 and the central part of the pixel region 112, and this variation leads directly to a difference in output signal. As a result, a difference in signal amount occurs between the end portion of the pixel array 112 and the central part of the pixel array 112 on the reproduced screen, and, even in the case where a subject with a uniform picture pattern is photographed, a pseudo-signal called "shading" occurs as a non-uniform picture pattern on the reproduced screen. If shading occurs, the shading becomes noise and, disadvantageously, the image quality of the reproduced screen is considerably degraded.

In addition, in the case where a subject with a very high luminance is imaged, photoelectrons, which are generated in the semiconductor substrate 140 by photoelectric conversion, flow into a power supply terminal in the unit pixel, and the photoelectrons flow out, as an electric current, to the outside of the imaging element via the contact and wiring.

As expressed by the above-described equation (2), the potential difference ΔV is added to the power supply potential of the unit pixel 1 which images the subject with high luminance. In this case, if the structure of the comparative example is adopted, the pads 141 for the reference potential are not distributively provided on the upper and lower surfaces, and the reference potential cannot distributively be applied to the pixel region 112 and the other region, resulting in a variation in signal output. Thus, a pseudo-signal occurs in a pixel which shares the power supply wiring with the pixel which images the subject with high luminance. Consequently, such disadvantages occur that a picture pattern becomes non-uniform on the reproduced screen, and the non-uniformity becomes noise and considerably degrades the image quality of the reproduced screen.

Other Examples of Application

Aside from the above descriptions, both the pads or ball lands for applying the reference potential and the pads or ball lands for applying the power supply potential may be disposed on the region overlapping the pixel region 12 on the signal scanning circuit formation surface side. In this case, since the variation in reference potential is suppressed and the variation in power supply potential is suppressed, a reproduced image with further reduced noise can advantageously be obtained.

The above-described embodiments are directed to the case in which the number of pads for applying the reference potential, which are provided on the signal scanning circuit formation surface side, is six. However, the number of these pads is not limited to six. It should suffice if at least one pad for reference potential application is provided on the region overlapping the pixel region 12, and the number of such pads is not limited.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
a pixel region and a driving circuit region which are disposed on a semiconductor substrate, the pixel region being configured such that a photoelectric conversion unit and a signal scanning circuit unit are included and a matrix of unit pixels is disposed, and the driving circuit region being configured such that a driving circuit for driving the signal scanning circuit unit is disposed;
a support substrate provided on the semiconductor substrate on a side where the signal scanning circuit unit is formed, the support substrate having a first main surface provided on a side of the semiconductor substrate, and a second main surface opposite to the first main surface;
a first via penetrating the support substrate and connected to a wiring in an interlayer insulating film provided on the semiconductor substrate;
a first pad which is provided on a peripheral region on the semiconductor substrate on a side of a light receiving surface, the light receiving surface being formed on a substrate surface which is opposite to a substrate surface where the signal scanning circuit unit is formed; and a second pad which is provided on the second main surface of the support substrate, which is disposed at a position overlapping the pixel region in a thickness direction of the semiconductor substrate, which is connected to the first via, and to which an external member is connected, wherein the first via, the second pad, and a bonding wire connected to the first via and the second pad are provided under the pixel region.

2. The device according to claim 1, wherein the second pad is supplied with at least a reference potential.

3. The device according to claim 2, wherein the signal scanning circuit unit includes at least a multilayer wiring, and includes an interlayer insulation film which is disposed between the semiconductor substrate and the support substrate, and the device further comprises a first diffusion layer which is electrically connected to the second pad and is provided on the interlayer insulation film on the semiconductor substrate side in association with each of the unit pixels.

4. The device according to claim 3, wherein the first diffusion layer is supplied with the reference potential, and has a lattice-shaped plan-view layout.

5. The device according to claim 3, wherein the first diffusion layer is supplied with the reference potential, and has a comb-shaped plan-view layout.

6. The device according to claim 2, wherein the signal scanning circuit unit includes at least a multilayer wiring, and includes an interlayer insulation film which is disposed between the semiconductor substrate and the support substrate, and the device further comprises a first diffusion layer and a second diffusion layer which are electrically connected to the second pad and are provided in the same layer level on the interlayer insulation film on the semiconductor substrate side in association with each of the unit pixels.

7. The device according to claim 6, wherein the first diffusion layer is supplied with the reference potential, and has a lattice-shaped plan-view layout.

8. The device according to claim 7, wherein the second diffusion layer is supplied with the reference potential, and has a comb-shaped plan-view layout.

9. The device according to claim 1, further comprising a first wiring layer which is disposed in the signal scanning circuit unit and is electrically connected to the first pad, thereby to apply a power supply potential.

10. The device according to claim 9, further comprising a second wiring layer which is disposed in the signal scanning circuit unit and is electrically connected to the second pad, thereby to apply a reference potential.

11. The device according to claim 1, further comprising:
an antireflection film which is provided on the semiconductor substrate on a light illumination surface side;
a plurality of color filters which are provided on the antireflection film in association with the unit pixels; and
a plurality of micro-lenses which are provided on the color filters in association with the unit pixels.

12. The device according to claim 1, wherein the external member is a solder ball.

13. The device according to claim 1, wherein the external member is a bonding wire.

14. The device according to claim 1, further comprising a second via penetrating the semiconductor substrate.

* * * * *